United States Patent
Nakagawa

(10) Patent No.: US 11,500,287 B2
(45) Date of Patent: Nov. 15, 2022

(54) ABLATION LAYER, PHOTOSENSITIVE RESIN STRUCTURE, METHOD FOR PRODUCING RELIEF PRINTING PLATE USING SAID PHOTOSENSITIVE RESIN STRUCTURE

(71) Applicant: ASAHI KASEI KABUSHIKI KAISHA, Tokyo (JP)

(72) Inventor: Norikiyo Nakagawa, Tokyo (JP)

(73) Assignee: ASAHI KASEI KABUSHIKI KAISHA, Tokyo (JP)

( * ) Notice: Subject to any disclaimer, the term of this patent is extended or adjusted under 35 U.S.C. 154(b) by 597 days.

(21) Appl. No.: 16/334,610

(22) PCT Filed: Sep. 15, 2017

(86) PCT No.: PCT/JP2017/033471
§ 371 (c)(1),
(2) Date: Mar. 19, 2019

(87) PCT Pub. No.: WO2018/056211
PCT Pub. Date: Mar. 29, 2018

(65) Prior Publication Data
US 2021/0229480 A1 Jul. 29, 2021

(30) Foreign Application Priority Data

Sep. 23, 2016 (JP) .............................. JP2016-185139
Jan. 20, 2017 (JP) .............................. JP2017-008426

(51) Int. Cl.
*G03F 7/033* (2006.01)
*G03F 7/11* (2006.01)
*G03F 7/20* (2006.01)

(52) U.S. Cl.
CPC ............. *G03F 7/033* (2013.01); *G03F 7/11* (2013.01); *G03F 7/202* (2013.01)

(58) Field of Classification Search
CPC ..................................... G03F 7/20; G03F 7/11
See application file for complete search history.

(56) References Cited

U.S. PATENT DOCUMENTS

| | | | |
|---|---|---|---|
| 5,719,009 A | 2/1998 | Fan | |
| 8,883,399 B2 * | 11/2014 | Iso ............................ | G03F 1/50 430/273.1 |
| 8,920,692 B2 | 12/2014 | Landry-Coltrain et al. | |
| 2003/0211419 A1 | 11/2003 | Fan | |
| 2010/0021842 A1 | 1/2010 | Kanga | |
| 2010/0167202 A1 | 7/2010 | Yoshimoto et al. | |
| 2011/0275016 A1 * | 11/2011 | Iso ........................... | G03F 7/202 430/270.1 |
| 2012/0288682 A1 | 11/2012 | Inoue et al. | |
| 2013/0260121 A1 | 10/2013 | Inoue et al. | |
| 2013/0269557 A1 | 10/2013 | Burberry et al. | |
| 2015/0079322 A1 | 3/2015 | Pellegrini et al. | |
| 2015/0241770 A1 * | 8/2015 | Yoshida .................... | B41N 1/12 430/288.1 |
| 2016/0131979 A1 * | 5/2016 | Becker ...................... | G03F 7/40 430/273.1 |

FOREIGN PATENT DOCUMENTS

| | | |
|---|---|---|
| EP | 2381309 | 10/2011 |
| JP | H08-305030 | 11/1996 |
| JP | H10-509254 | 9/1998 |
| JP | 2006-163284 | 6/2006 |
| JP | 2010-276916 | 12/2010 |
| JP | 2012-068423 | 4/2012 |
| JP | 2012-511174 | 5/2012 |
| JP | 2012-137515 | 7/2012 |
| JP | 2014-119594 | 6/2014 |
| JP | 2014-160161 A | 9/2014 |
| JP | 2015-011330 | 1/2015 |
| WO | 2009/150703 | 12/2009 |
| WO | 2010-070918 | 6/2010 |
| WO | 2010-150844 | 12/2010 |
| WO | 2011/118052 | 9/2011 |

OTHER PUBLICATIONS

Supplemental European Search Report issued for EP17852984.8 dated Sep. 10, 2019.
International Search Report in International Patent Application No. PCT/JP2017/033471, dated Nov. 28, 2017 with English translation.
International Preliminary Report on Patentability in International Patent Application No. PCT/JP2017/033471, dated Mar. 26, 2019 with English translation.

* cited by examiner

*Primary Examiner* — Chanceity N Robinson
(74) *Attorney, Agent, or Firm* — Greenblum & Bernstein P.L.C.

(57) ABSTRACT

An ablation layer for a photosensitive resin for a relief printing plate, the ablation layer containing at least an acid-modified polymer and an infrared-absorbing agent and having a layer acid value as defined below of 2 mg KOH/g or more and 400 mg KOH/g or less, and a neutralized salt ratio as defined below of 0.9 or less, wherein the Layer acid value=(Acid value of the acid-modified polymer)×(Mass ratio of the acid-modified polymer to an entire ablation layer); and wherein the Neutralized salt ratio=(Number of moles of polymer wherein acid in the acid-modified polymer exists in neutralized salt state)/(Total number of moles of the acid-modified polymer).

14 Claims, No Drawings

ABLATION LAYER, PHOTOSENSITIVE
RESIN STRUCTURE, METHOD FOR
PRODUCING RELIEF PRINTING PLATE
USING SAID PHOTOSENSITIVE RESIN
STRUCTURE

TECHNICAL FIELD

The present invention relates to an ablation layer for a photosensitive resin for relief printing, a photosensitive resin structure including the ablation layer, and a method for producing a relief printing plate using the photosensitive resin structure.

BACKGROUND ART

In recent years, CTP (Computer To Plate) technology in flexographic plate-making has been developed in the technology for producing a photosensitive resin structure for a flexographic printing plate.

In the CTP technology for the flexographic printing plate, a method has been proposed in which a layer that can be ablation-processed by infrared rays is provided on a photosensitive resin composition, a desired shape of the ablation layer is removed by irradiation of infrared lasers to form an activation-ray transmitting portion that corresponds to the negative, then the photosensitive resin composition is irradiated with activation rays, with the ablation layer serving as a mask, to react the photosensitive resin composition in the same shape as the transmitting portion formed in the ablation layer, and finally the ablation layer and the unexposed portion of the photosensitive resin composition that are no longer necessary are dissolved or swollen by a developer and removed by applying external force with a brush or the like (see, for example, Patent Literature 1).

In particular, a photosensitive resin composition and an ablation layer removable by an aqueous developer are preferable from various viewpoints, such as a health aspect of a worker because the waste liquid after development does not contain an organic solvent, a safety aspect because the waste liquid is not flammable, and an environmental aspect because the waste liquid does not produce toxic gas or carbon dioxide during treatment of the waste liquid.

Moreover, it is more preferable from the viewpoint of process simplicity that the photosensitive resin composition and the ablation layer can be developed by the same developer.

From such viewpoints, a photosensitive resin structure including a photosensitive resin composition and an ablation layer that can be developed by the same aqueous developer has been proposed (see, for example, Patent Literature 2).

However, in the previously proposed photosensitive resin structure that can be developed by the same aqueous developer, the ablation layer is barely soluble or can be swollen by the developer for the photosensitive resin composition (see, for example, Patent Literature 3), thus it takes time to develop the ablation layer, and there are problems of poor production efficiency.

In view of these problems, an ablation layer in which a water-soluble binder is used has been proposed (see, for example, Patent Literature 4).

The ablation layer in which a water-soluble binder is used can be promptly developed by an aqueous developer but, on the other hand, due to the characteristics of being soluble in neutral water, the ablation layer likely absorbs moisture, and when a cover film of the ablation layer is peeled off, wrinkles are formed on the ablation layer due to moisture absorption, and irregularities are produced on the surface. It is thus difficult to focus lasers and, as a result, there are problems in that the definition of a formed image is poor.

In order to solve these problems, a technology for forming an ablation layer by using an anionic polymer has been proposed (see, for example, Patent Literature 5). In this technology, it is possible to prevent moisture absorption to such an extent that production of wrinkles on the ablation layer as described above can be suppressed.

CITATION LIST

Patent Literature

Patent Literature 1: Japanese Unexamined Patent Application Publication (Translation of PCT Application) No. 1998-509254
Patent Literature 2: Japanese Unexamined Patent Application Publication No. 2006-163284
Patent Literature 3: Japanese Unexamined Patent Application Publication No. 2012-137515
Patent Literature 4: WO 2010/150844
Patent Literature 5: WO 2010/070918

SUMMARY OF INVENTION

Technical Problem

However, the infrared ablation layer disclosed in Patent Literature 5 has poor ability to prevent moisture absorption over time, and gradually absorbs moisture during the time from post-production storage to use. When the ablation layer gradually absorbs moisture, adhesion at the interface between the ablation layer and the cover film, which is usually low, is increased, and the cover film that should be smoothly peeled off causes peeling failure. As a result, there are problems in that a trouble occurs, i.e., peeling occurs at the interface between the ablation layer and the photosensitive resin layer while the ablation layer and the cover film remain firmly adhered.

Accordingly, in view of the problems of conventional art described above, an object of the present invention is to provide an ablation layer for a photosensitive resin for a relief printing plate, which can be promptly developed by an alkaline aqueous developer used for a photosensitive resin layer constituting a photosensitive resin structure and which can prevent moisture absorption over time, a photosensitive resin structure including the ablation layer, and a relief printing plate in which the photosensitive resin structure is used.

Solutions to Problems

As a result of having conducted diligent research and extensive experimentation to solve the problems, the inventor found that an ablation layer for a relief printing photosensitive resin, which contains an acid-modified polymer and an infrared-absorbing agent and has a layer acid value and a neutralized salt ratio as defined below in predetermined numerical ranges, can solve the above problems, and accomplished the present invention:

Layer acid value=(Acid value of the acid-modified polymer)×(Mass ratio of the acid-modified polymer to an entire ablation layer); and Neutralized salt ratio=(Number of moles of polymer wherein acid in the acid-modified polymer exists in neutralized salt state)/(Total number of moles of the acid-modified polymer).

That is to say, the present invention is as set forth below.

[1] An ablation layer for a photosensitive resin for a relief printing plate, the ablation layer comprising at least an acid-modified polymer and an infrared-absorbing agent and having a layer acid value as defined below of 2 mg KOH/g or more and 400 mg KOH/g or less, and a neutralized salt ratio as defined below of 0.9 or less:

Layer acid value=(Acid value of the acid-modified polymer)×(Mass ratio of the acid-modified polymer to an entire ablation layer); and Neutralized salt ratio=(Number of moles of polymer wherein acid in the acid-modified polymer exists in neutralized salt state)/(Total number of moles of the acid-modified polymer).

[2] The ablation layer of the photosensitive resin layer for the relief printing plate according to [1], wherein an acidic group of the acid-modified polymer is a carboxylic acid group or a phosphoric acid group.

[3] The ablation layer for the photosensitive resin for the relief printing plate according to [1] or [2], wherein a content of the acid-modified polymer based on the entire ablation layer is 0.5% by mass or more and 90% by mass or less.

[4] The ablation layer of the photosensitive resin layer for the relief printing plate according to any one of [1] to [3], wherein the acid-modified polymer is an acid-modified acrylic resin.

[5] The ablation layer for the photosensitive resin for the relief printing plate according to any one of [1] to [4], wherein the acid-modified polymer has a number average molecular weight of 1000 or more and 20000 or less.

[6] The ablation layer for the photosensitive resin for the relief printing plate according to any one of [1] to [5], wherein the acid-modified polymer has a glass transition temperature of 40° C. or less.

[7] The ablation layer for the photosensitive resin for the relief printing plate according to any one of [1] to [6], wherein the infrared-absorbing agent is carbon black.

[8] The ablation layer for the photosensitive resin for the relief printing plate according to any one of [1] to [7], further comprising at least one polymer different from the acid-modified polymer.

[9] The ablation layer for the photosensitive resin for the relief printing plate according to [8], wherein the polymer different from the acid-modified polymer has a water absorption of 15% or less, and the water absorption is a value obtained when moisture is absorbed until equilibrium is reached at 23° C. and 60% RH by a method in accordance with JIS K 7209.

[10] The ablation layer for the photosensitive resin for the relief printing plate according to [8] or [9], wherein the polymer different from the acid-modified polymer is at least one selected from the group consisting of a thermoplastic elastomer composed of a copolymer of a monovinyl-substituted aromatic hydrocarbon monomer and a conjugated diene monomer, a hydrogenated product of the copolymer, and a modified product of the copolymer.

[11] The ablation layer for the photosensitive resin for the relief printing plate according to [8] or [9], wherein the polymer different from the acid-modified polymer is at least one selected from a polyamide and a modified product thereof.

[12] The ablation layer for the photosensitive resin for the relief printing plate according to any one of [8] to [11], wherein the polymer different from the acid-modified polymer comprises a copolymer composed of a monovinyl-substituted aromatic hydrocarbon monomer and an unsaturated dicarboxylic anhydride, and in the copolymer composed of a monovinyl-substituted aromatic hydrocarbon monomer and an unsaturated dicarboxylic anhydride, the unsaturated dicarboxylic anhydride is partially or entirely ring-opened by esterification.

[13] The ablation layer for the photosensitive resin for the relief printing plate according to any one of [1] to [12], further comprising a silicone resin.

[14] A photosensitive resin structure for a relief printing plate, comprising at least:

a support, a photosensitive resin layer disposed on the support, and the ablation layer according to any one of [1] to [13] disposed on the photosensitive resin layer.

[15] A method for producing a relief printing plate, comprising the steps of:

irradiating the photosensitive resin structure for a relief printing plate according to [14] with an ultraviolet ray from a support side;

performing pattern drawing processing by irradiating the ablation layer with an infrared ray;

exposing a pattern by irradiating the photosensitive resin layer with an ultraviolet ray; and removing the ablation layer and an unexposed portion of the photosensitive resin layer by an alkaline developer.

[16] The photosensitive resin structure for the relief printing plate according to [14], further comprising an oxygen inhibiting layer between the photosensitive resin layer and the ablation layer.

[17] The photosensitive resin structure for the relief printing plate according to [16], wherein the oxygen inhibiting layer has an oxygen permeability of 4000 cc·20 μm/m²·24 hr·atm or less.

[18] The photosensitive resin structure for the relief printing plate according to [16] or [17], wherein the oxygen inhibiting layer is soluble in a solution containing water in an amount of 50% by mass or more.

[19] The photosensitive resin structure for the relief printing plate according to any one of [16] to [18], wherein the oxygen inhibiting layer is at least one selected from the group consisting of polyvinyl alcohol, partially saponified polyvinyl acetate, a partially saponified poly(ethylene oxide vinyl acetate) graft copolymer, and a water-soluble poly(ethylene-vinyl alcohol) copolymer.

[20] The photosensitive resin structure for the relief printing plate according to any one of [16] to [19], wherein the oxygen inhibiting layer comprises polyvinyl alcohol and/or partially saponified polyvinyl acetate.

[21] The photosensitive resin structure for the relief printing plate according to [20], wherein the polyvinyl alcohol and/or the partially saponified polyvinyl acetate comprised in the oxygen inhibiting layer has a degree of saponification of 40 mol % or more and 90 mol % or less.

[22] The photosensitive resin structure for the relief printing plate according to any one of [16] to [21], wherein the oxygen inhibiting layer has a thickness of 0.1 μm or more and 100 μm or less.

[23] A method for producing a relief printing plate, comprising the steps of:

irradiating the photosensitive resin structure for a relief printing plate according to any one of [16] to [22] with an ultraviolet ray from a support side;

performing pattern drawing processing by irradiating the ablation layer with an infrared ray;

exposing a pattern by irradiating the photosensitive resin layer with an ultraviolet ray through the oxygen inhibiting layer; and removing the ablation layer, the oxygen inhibiting layer, and an unexposed portion of the photosensitive resin layer by an alkaline developer.

Advantageous Effects of Invention

According to the present invention, an ablation layer for a photosensitive resin for a relief printing plate, which can be promptly developed by an alkaline aqueous developer used for a photosensitive resin layer constituting a photosensitive resin structure and which can prevent moisture absorption over time, a photosensitive resin structure including the ablation layer, and a relief printing plate in which the photosensitive resin structure is used can be obtained.

DESCRIPTION OF EMBODIMENT

Below, an embodiment for carrying out the present invention (hereinafter referred to as "the present embodiment") will now be described in detail.

Note that the present invention is not limited to the following description, and can be carried out after making various modifications within the scope of the invention.

[Ablation Layer]

The ablation layer of the present embodiment is an ablation layer constituting a photosensitive resin structure for a relief printing plate, which will be described below, and drawing processing by infrared rays can be performed.

The ablation layer contains at least an acid-modified polymer and an infrared-absorbing agent.

The polymer in the present application refers to a polymer having a repeating structure, in which a plurality of monomers as its basic units are joined, and a molecular weight of 500 or more.

The acid-modified polymer refers to a polymer designed and produced such that the molecular chain is modified by an acidic group.

The ablation layer of the present embodiment has a layer acid value represented by the following formula of 2 mg KOH/g or more and 400 mg KOH/g or less:

Layer acid value=(Acid value of acid-modified polymer)×(Mass ratio of acid-modified polymer to an entire ablation layer).

Also, the ablation layer of the present embodiment has a neutralized salt ratio represented by the following formula of 0.9 or less:

Neutralized salt ratio=(Number of moles of polymer wherein acid in the acid-modified polymer exists in neutralized salt state)/(Total number of moles of the acid-modified polymer).

The ablation layer of the present embodiment can be removed by allowing it to be promptly dissolved or dispersed in an alkaline developer described below. Moreover, moisture absorption over time can be prevented.

As a method for shortening the developing time of the ablation layer, it is preferable to make the ablation layer thin. On the other hand, in order to ensure sufficient strength of the ablation layer, a method that increases the development speed of the ablation layer and ensures the thickness of the ablation layer is more preferable. From these viewpoints, the ablation layer needs to have characteristics of being barely soluble or insoluble in neutral water and being soluble or dispersible in alkaline water.

In order to have such characteristics, in the present embodiment, the acid value of the entirety of the ablation layer (a layer acid value) is in the above specific numerical range.

From the viewpoint of suppressing moisture absorption over time, in the ablation layer of the present embodiment, the neutralized salt ratio of the acid-modified polymer is in the above specific numerical range.

In the ablation layer of the present embodiment, the acid value of the entire layer is referred to as a layer acid value, and is defined as follows.

The layer acid value is a numerical value obtained by multiplying the acid value (unit in mg KOH/g) of a component that has an acidic group and is contained in the ablation layer, i.e., the acid-modified polymer, by the mass ratio of the component that has an acidic group, i.e., the acid-modified polymer, to the entire ablation layer.

When there are a plurality of acid-modified polymers, the sum of numerical values as described above determined for polymer components is the layer acid value of the ablation layer.

For example, in the case of a layer containing 20% by mass of a polymer having an acid value of 50 mg KOH/g, the layer acid value thereof is 50×0.2=10 mg KOH/g.

The ablation layer of the present embodiment needs to have a layer acid value of 2 mg KOH/g or more in order to be promptly developable by an alkaline aqueous developer used for the photosensitive resin layer. When the layer acid value is 2 mg KOH/g or more, solubility and dispersibility in the alkaline aqueous developer are increased.

When 400 mg KOH/g or less, components responsible for the function of the ablation layer, such as an infrared-absorbing agent, and other components for enhancing the properties of the layer can be added in sufficient amounts.

From the above-described viewpoints, the lower limit of the layer acid value of the ablation layer is preferably 6 mg KOH/g or more, more preferably 8 mg KOH/g or more, and further preferably 10 mg KOH/g or more. The upper limit of the layer acid value is preferably 100 mg KOH/g or less, more preferably 80 mg KOH/g or less, and further preferably 70 mg KOH/g or less.

An example of a method for determining the layer acid value of the ablation layer of the present embodiment through experimentation is as follows.

First, the ablation layer is dissolved in an organic solvent or the like, and the content of the acid-modified polymer in the ablation layer is determined by gas chromatography or the like.

Next, each component of the ablation layer is separated by column chromatography or the like to isolate the acid-modified polymer, and the acid value of the acid-modified polymer is determined by a potentiometric titration method using a potassium hydroxide solution in accordance with ISO 6619.

Finally, the acid value of the acid-modified polymer determined by a potentiometric titration method is multiplied by the content of the polymer to thereby determine the layer acid value.

The layer acid value of the ablation layer of the present embodiment can be controlled to the range of 2 mg KOH/g or more and 400 mg KOH/g or less by suitably regulating the type of the acid-modified polymer and the content thereof.

In the ablation layer of the present embodiment, the proportion of a polymer that has become a neutralized salt form from the acid-modified polymer to the total amount of the acid-modified polymer in the ablation layer is referred to as a neutralized salt ratio, and is defined as follows.

The neutralized salt ratio is a numerical value obtained by dividing the number of moles of a polymer wherein the acid in the acid-modified polymer exists in a neutralized salt state by the total number of moles of the acid-modified polymer.

When there are a plurality of acid-modified polymers, the numbers of moles of polymers existing in a neutralized salt state for polymer components are summed, and divided by the total number of moles of the polymer components, and the result is the neutralized salt ratio of the ablation layer.

For example, when 10 moles of an acid-modified polymer wherein 2 moles of the acid-modified polymer is in a neutralized salt form is added to the ablation layer, the neutralized salt ratio is 2/10=0.2.

In commonly used acid-modified polymers, a polymer existing in an acid form is more hydrophobic and less moisture absorbable, and a polymer existing in a neutralized salt form is more hydrophilic and more moisture absorbable. Therefore, when less moisture absorbability is desired, a lower neutralized salt ratio is preferable.

In the ablation layer of the present embodiment, the neutralized salt ratio needs to be 0.9 or less in order to prevent moisture absorption over time.

From the viewpoint of more effectively preventing moisture absorption over time, the neutralized salt ratio is preferably 0.5 or less, more preferably 0.3 or less, further preferably 0.2 or less, and still more preferably 0.1 or less.

An example of a method for determining the neutralized salt ratio of the ablation layer of the present embodiment through experimentation is as follows.

First, the ablation layer is dissolved in an organic solvent or the like, and the total number of moles of the acid-modified polymer existing in the ablation layer is determined by gas chromatography or the like.

Next, the number of moles of the acid-modified polymer in an acid form is determined by a neutralization titration method.

Finally, the number of moles of the acid form is subtracted from the total number of moles to obtain the number of moles of the neutralized salt form, which is divided by the total number of moles previously obtained.

Thus, the neutralized salt ratio is determined.

By adding an acid or a base as long as the characteristics of the ablation layer are not adversely affected, the neutralized salt ratio of the acid-modified polymer can be suitably regulated to the above numerical range.

Examples of the acidic group of the acid-modified polymer include, but are not limited to, a carboxylic acid group, a sulfonic acid group, and a phosphoric acid group.

Among these, from the viewpoint of ease of synthesis and availability, a carboxylic acid group and a phosphoric acid group are preferable, and from the viewpoint of low moisture absorbability, a carboxylic acid group is more preferable.

In the ablation layer of the present embodiment, the hydroxyl group is not encompassed within the acidic group.

Examples of the polymer for the acid-modified polymer contained in the ablation layer include, but are not limited to, an acrylic resin, a styrene resin, a vinyl chloride resin, a vinylidene chloride resin, a polyolefin resin, a polyamide resin, a polyacetal resin, a polycarbonate resin, a polyester resin, a polyphenylene sulfide resin, a polysulfone resin, a polyether ketone resin, a polyimide resin, a fluorine resin, a silicone resin, a urethane resin, a urea resin, a melamine resin, a guanamine resin, an epoxy resin, a phenol resin, and copolymers of these resins.

One of these polymers may be used singly, or two or more may be used in combination.

Among these polymers, from the viewpoint of ease of modification by an acidic group and suppression of wrinkles resulting from moisture absorption, an acrylic resin, a polyolefin resin, a polyamide resin, a polyacetal resin, a polycarbonate resin, a polyether ketone resin, and a polyimide resin are preferable, and an acrylic resin is more preferable.

The number average molecular weight of the acid-modified polymer can be suitably set, and may be selected in consideration of the intended flexibility, scratch resistance, crack resistance, and the like of the ablation layer. In general, the smaller the number average molecular weight, the softer and the more susceptible to scratches and, on the other hand, the greater the number average molecular weight, the harder and the more brittle.

From the viewpoint of the scratch resistance of the ablation layer, the number average molecular weight of the acid-modified polymer is preferably 1000 or more, more preferably 1500 or more, and further preferably 2000 or more.

In consideration of flexibility and crack resistance, the number average molecular weight is preferably 20000 or less, more preferably 18000 or less, and further preferably 15000 or less.

The upper and lower limits of these numerical values are in any combination.

The number average molecular weight of the acid-modified polymer can be controlled to the above numerical range by suitably regulating the polymerization conditions of the polymer, e.g., polymerization conditions such as the amount of monomer, the polymerization time, and the polymerization temperature.

It is also effective to mix a plurality of polymers to obtain the desired number average molecular weight.

The glass transition temperature of the acid-modified polymer in the ablation layer of the present embodiment can be suitably set from the viewpoint of handleability, the desired solvent solubility, and the like.

In consideration of the rate of dissolution in a solvent and the possibility of precipitation in a mixed solvent system, the glass transition temperature of the acid-modified polymer is preferably 40° C. or less, more preferably 30° C. or less, further preferably 15° C. or less, and still more preferably 0° C. or less.

The glass transition temperature of the acid-modified polymer can be controlled to the above numerical range by suitably regulating the polymerization conditions of the polymer, e.g., polymerization conditions such as the amount of monomer, the polymerization time, and the polymerization temperature.

The content of the acid-modified polymer in the entire ablation layer of the present embodiment can be suitably set as long as the object of the present invention is not impaired.

From the viewpoint of ensuring sufficient solubility in an alkaline aqueous developer, the content of the acid-modified polymer in the entire ablation layer is preferably 0.5% by mass or more, more preferably 1% by mass or more, further preferably 5% by mass or more, and still more preferably 10% by mass or more.

On the other hand, from the viewpoint of increasing the concentration of an infrared-absorbing agent such as carbon black in order to increase sensitivity to infrared rays, it is preferably 90% by mass or less, more preferably 80% by mass or less, further preferably 40% by mass or less, and yet more preferably 20% by mass or less. The upper and lower limits of these numerical values are in any combination.

The ablation layer of the present embodiment contains an infrared-absorbing agent.

As an infrared-absorbing agent, a simple substance or a compound having strong absorbance at a wavelength in the range of 750 nm to 20000 nm is usually used. An infrared-absorbing agent that also serves as a non-infrared shielding material is preferable, and an infrared-absorbing agent and a non-infrared shielding material may be separately added.

An infrared-absorbing agent that has high absorbability in the infrared region and that is capable of being uniformly dispersed in the ablation layer is preferable. Examples of such materials include, but are not limited to, colorants, e.g., inorganic pigments such as carbon black, graphite, iron oxide, chromium oxide, and copper chromite, phthalocyanine and substituted phthalocyanine derivatives, cyanine dyes, merocyanine dyes and polymethine dyes, and metal thiolate dyes.

As a non-infrared shielding material, a substance that reflects or absorbs an ultraviolet ray can be used. Suitable examples thereof include, but are not limited to, carbon black, ultraviolet-absorbing agents, graphite, and the like.

Regarding both infrared-absorbing agents and non-infrared shielding materials, one may be used singly, or two or more may be used in combination.

As an infrared-absorbing agent, carbon black which also has a non-infrared shielding effect, is readily available, and is inexpensive is particularly preferable.

The particle size of carbon black can be selected to be in a suitable range, but in general, the smaller the particle size, the higher the sensitivity to infrared rays and the poorer the dispersibility. From the above viewpoints, the particle size of carbon black is preferably 20 nm or more and 80 nm or less, more preferably 25 nm or more and 70 nm or less, and further preferably 30 nm or more and 60 nm or less.

It is preferable that the content of the infrared-absorbing agent in the ablation layer is selected from a range in which sensitivity that enables removal by the laser beam used is ensured when performing drawing processing on the ablation layer and the infrared-absorbing agent is added.

There is a tendency that the larger the amount of the infrared-absorbing agent uniformly dispersed in the ablation layer, the higher the sensitivity to the laser beam, and, on the other hand, the sensitivity to the laser beam is lowered when the infrared-absorbing agent is excessive and undergoes aggregation or the like. From this viewpoint, the content of the infrared-absorbing agent in the entire ablation layer of the present embodiment is preferably 10% by mass or more and 90% by mass or less, more preferably 20% by mass or more and 80% by mass or less, and further preferably 30% by mass or more and 70% by mass or less.

As for the non-infrared shielding effect of the ablation layer of the present embodiment, the optical density of the ablation layer is preferably 2 or more, and the optical density is more preferably 3 or more. The optical density can be measured using a D200-II transmission densitometer (manufactured by GretagMacbeth). The optical density is a so-called visual sensation (ISO visual), and light to be measured is in a wavelength region of about 400 to 750 nm.

Other than the acid-modified polymer and the infrared-absorbing agent, a suitable component can be added to the ablation layer of the present embodiment without departing from the object of the present invention.

From the viewpoints of suppressing moisture absorption of the ablation layer, increasing hardness, and increasing adhesion between the ablation layer and the photosensitive resin layer described below, it is preferable to further add at least one polymer that is different from the acid-modified polymer.

From the viewpoint of suppressing moisture absorption, the polymer different from the acid-modified polymer preferably has a water absorption of 15% or less. When the water absorption is in this range, the moisture absorption suppressing effect can be more effectively exerted. The water absorption is more preferably 10% or less, and further preferably 5% or less.

The water absorption in the present application is a value obtained when moisture is absorbed until equilibrium is reached at 23° C. and 60% RH by a method described in JIS K 7209.

From the viewpoints of suppressing moisture absorption, increasing hardness, and increasing adhesion between the ablation layer and the photosensitive resin layer, the polymer different from the acid-modified polymer is preferably a thermoplastic elastomer composed of a copolymer of a monovinyl-substituted aromatic hydrocarbon monomer and a conjugated diene monomer, a hydrogenated product of the copolymer, or a modified product of the copolymer.

The proportions of the monovinyl-substituted aromatic hydrocarbon monomer and the conjugated diene monomer can be suitably set. In general, the higher the proportion of the monovinyl-substituted aromatic hydrocarbon monomer, the more effective for increasing hardness, and the higher the proportion of the conjugated diene monomer, the more effective for increasing flexibility. From this viewpoint, the proportion of the monovinyl-substituted aromatic hydrocarbon monomer is preferably 10% by mass or more and 90% by mass or less, more preferably 20% by mass or more and 80% by mass or less, and further preferably 30% by mass or more and 70% by mass or less.

Specific examples thereof include a styrene-butadiene copolymer, a styrene-butadiene-styrene copolymer, a styrene-ethylene-butadiene-styrene copolymer, a styrene-isoprene copolymer, and a styrene-isoprene-styrene copolymer.

The copolymer may be any of an alternate copolymer, a random copolymer, a block copolymer, and a graft copolymer.

As for a modifying agent, for example, modification is carried out with maleic anhydride amine.

As the polymer different from the acid-modified polymer, it is also preferable to add a polymer having a relatively high polarity from the viewpoint of a polarity close to and high compatibility with the acid-modified polymer. Examples of such polymers include a polyamide, a polyimide, and modified products thereof. A polyamide and a modified product thereof are more preferable from the viewpoint of excellent formability of a coating solution.

One of the above-described polymers different from the acid-modified polymer may be used singly, or two or more may be used in combination.

From the viewpoint of exerting the above-described properties, the amount of the polymers different from the acid-modified polymer added is preferably 5% by mass or more, more preferably 10% by mass or more, and further preferably 15% by mass or more in the ablation layer.

From the viewpoint of sufficiently ensuring the amounts of the infrared-absorbing agent and the acid-modified polymer added, the amount of the polymers different from the acid-modified polymer added is preferably 80% by mass or less, more preferably 70% by mass or less, and further preferably 60% by mass or less.

A pattern is drawn on the ablation layer of the present embodiment by an infrared ray in the process of producing a relief printing plate. When external force or the like is applied to the ablation layer and scratches are created, the precision of pattern drawing is impaired. Therefore, the ablation layer preferably has high scratch resistance.

As described above, the scratch resistance of the ablation layer can be increased by a method such as increasing the number average molecular weight of the acid-modified polymer but, at the same time, the ablation layer possibly becomes hard and brittle. Accordingly, the range of the type of the acid-modified polymer to be selected is limited. Moreover, in general, there is a tendency that the lower the glass transition temperature of the acid-modified polymer, the lower the scratch resistance.

In order to increase the scratch resistance of the ablation layer of the present embodiment, it is effective to further contain as the polymer different from the acid-modified polymer a copolymer composed of a monovinyl-substituted aromatic hydrocarbon monomer and an unsaturated dicarboxylic anhydride, wherein the unsaturated dicarboxylic anhydride is partially or entirely ring-opened by esterification to form a half ester (hereinafter sometimes simply referred to as a ring-opened copolymer).

The half ester refers to a state wherein one of the ring-opened dicarboxylic acids is esterified, and the other remains to be a carboxylic acid.

As for the extent of ring-opening of the unsaturated dicarboxylic acid anhydride, from the viewpoint of exerting the properties described below, preferably 10% or more is ring-opened and forms a half ester, more preferably 20% or more is ring-opened, and further preferably 30% or more is ring-opened.

The carboxylic acid of the ring-opened moiety of the ring-opened copolymer and the acid-modified polymer both have a high polarity, and therefore high compatibility can be obtained. On the other hand, the monovinyl-substituted aromatic hydrocarbon moiety in the ring-opened copolymer and the alkyl group and the like of the ester are portions having a polarity lower than that of carboxylic acid, therefore increase compatibility with a component having a similarly low polarity, such as a thermoplastic elastomer composed of the copolymer of a monovinyl-substituted aromatic hydrocarbon monomer and a conjugated diene monomer, a hydrogenated product of the copolymer, and a modified product of the copolymer and, at the same time, increase solubility in a lower-polarity organic solvent. In general, the acid-modified polymer and the lower-polarity component may undergo phase separation due to the different polarities. However, in the above-described case, a high-polarity carboxylic acid moiety, a low-polarity monovinyl-substituted aromatic hydrocarbon moiety, and a low-polarity alkyl group moiety of the ester are contained in the same molecular chain, and therefore compatibility is increased. Moreover, due to the increased compatibility, a more uniform ablation layer can be obtained, and scratch resistance is also increased. Accordingly, the compatibility of the components is increased, a component from which excellent scratch resistance can be obtained is uniformly added, and therefore the scratch resistance of the entire ablation layer is further increased.

From the viewpoints of increasing compatibility with a low-polarity component and ensuring sufficient stability, the unsaturated dicarboxylic acid ester of the ring-opened copolymer preferably has 8 or more and 18 or fewer carbon atoms in the ester chain of the unsaturated dicarboxylic acid.

Specifically, the unsaturated dicarboxylic acid ester of the ring-opened copolymer is preferably an alkyl ester. From the viewpoint of increasing compatibility with a low-polarity component in particular, a long alkyl chain is preferable and, on the other hand, from the viewpoint of stability, a short alkyl chain is preferable. From the above viewpoints, a C8-C18 alkyl ester is preferable. The alkyl may be linear or branched.

Examples of such ring-opened copolymers include, but are not limited to, alkyl half esters wherein a copolymer of styrene-maleic anhydride or a substituted product thereof is partially ring-opened. The copolymer may be any of an alternate copolymer, a random copolymer, a block copolymer, and a graft copolymer.

From the viewpoint of exerting the properties described above, the amount of the ring-opened copolymer added is preferably 10 parts by mass or more, more preferably 30 parts by mass or more, and further preferably 50 parts by mass or more based on 100 parts by mass of the acid-modified polymer.

In consideration of increasing the concentration of the infrared-absorbing agent such as carbon black to increase sensitivity to infrared rays, the amount is preferably 400 parts by mass or less, more preferably 300 parts by mass or less, and further preferably 200 parts by mass or less.

The state wherein the ring is opened by partial esterification may be a state wherein the ring is opened at the time of addition as a source material, or may be a state wherein the ring is opened through a reaction or the like after addition.

As will be described below, the ablation layer is usually formed into a film on a cover film, and at the time of film formation, the ablation layer is generally formed into a film through applying it in a solution or dispersion state to a cover film and drying it.

It is preferable to add a surfactant to increase the wettability of the cover film with the solution or the dispersion and the uniformity of the film.

As the surfactant, a commonly used nonionic, cationic, anionic, or amphoteric surfactant is applicable, and is suitably selected.

The cover film is peeled off from the ablation layer when the ablation layer is used.

From the viewpoint of making it easy to peel off the cover film, an additive that facilitates peeling is preferably added to the ablation layer. For this reason, a silicone resin, a fluorine surfactant, or the like is preferably added.

Examples of the silicone resin include, but are not limited to, unmodified silicone oils such as dimethyl silicone oil and methyl phenyl silicone oil; and modified silicone oils such as polyether-modified silicone, aralkyl-modified silicone, fluoroalkyl-modified silicone, and long chain alkyl-modified silicone.

Examples of the fluorine surfactant include, but are not limited to, a perfluoroalkyl group-containing acid salt, a perfluoroalkyl group-containing ester, and a fluoro group-containing oligomer.

Among these, in consideration of the gas generated during ablation, a silicone resin is more preferable from an environmental aspect, and from the viewpoint of balancing between peelability and the coating stability of a coating solution for forming the ablation layer in particular, polyether-modified silicone is preferable.

The ablation layer of the present embodiment preferably contains various surfactants and additives to increase wettability and peelability. The contents of the surfactants and additives can be suitably set as long as the effect of the present invention is not impaired.

The range in which these surfactants and additives suitably exert effects is preferably 0.1% by mass or more and 30% by mass or less, more preferably 0.5% by mass or more and 25% by mass or less, and further preferably 1.0% by mass or more and 20% by mass or less.

These surfactants and additives may be either water-soluble or water-insoluble as long as the moisture absorbability of the ablation layer is not significantly increased, and are more preferably water-insoluble from the viewpoint of moisture absorbability.

The film thickness of the ablation layer of the present embodiment is preferably large from the viewpoint of ensuring light shielding properties against ultraviolet rays during the step of performing exposing processing on the photosensitive resin structure described below, and is preferably small from the viewpoint of increasing ablation properties.

For the above reasons, the film thickness of the ablation layer is preferably 0.1 μm or more and 20 μm or less, more preferably 0.5 μm or more and 15 μm or less, and further preferably 1.0 μm or more and 10 μm or less.

The solvent of the solution or dispersion for forming a film of the ablation layer of the present embodiment can be suitably selected in consideration of the solubility of the polymer and/or carbon black used.

A plurality of solvents may be used as a mixture.

It is also effective to improve the film quality of the ablation layer by, for example, controlling the volatilization rate of the solvent by mixing a solvent having a relatively low boiling point and a solvent having a high boiling point.

Examples of the solvent for forming a film of the ablation layer include, but are not particularly limited to, toluene, xylene, cyclohexane, methyl acetate, ethyl acetate, propyl acetate, butyl acetate, amyl acetate, methyl ethyl ketone, acetone, cyclohexanone, ethylene glycol, propylene glycol, propylene glycol monomethyl ether, propylene glycol monomethyl ether acetate, dimethylacetamide, dimethylformamide, n-propyl alcohol, i-propyl alcohol, 1,4-dioxane, tetrahydrofuran, diethyl ether, n-hexane, n-heptane, n-pentane, acetonitrile, and analogs thereof.

The cover film for forming a film of the ablation layer of the present embodiment is preferably a film having excellent dimensional stability, and, for example, a polyethylene terephthalate film or the like is preferable.

The cover film may be used in an untreated state, and may be used after receiving functions through mold-releasing treatment, antistatic treatment, and the like as necessary.

[Photosensitive Resin Structure]

The photosensitive resin structure of the present embodiment is configured to include a support, a photosensitive resin layer disposed on the support, and the above-described ablation layer disposed on the photosensitive resin layer.

In general, a cover film is further laminated on the ablation layer.

The support (a base film) constituting the photosensitive resin structure of the present embodiment is preferably a film having excellent dimensional stability, and, for example, a film obtained by laminating an adhesive layer on a polyethylene terephthalate film is applicable. An easily adhering coating film may be laminated between the polyester film and the adhesive layer.

The photosensitive resin layer is not particularly limited as long as it is cured by being irradiated with ultraviolet rays, and uncured portions can be removed by a developer. The photosensitive resin layer is generally composed of a photosensitive resin component, a polymerizable monomer component, a photopolymerization initiator, and a stabilizer.

In the photosensitive resin structure for a relief printing plate of the present embodiment, an oxygen inhibiting layer may be further provided between the photosensitive resin layer and the ablation layer.

When the photosensitive resin layer is cured by being irradiated with an ultraviolet ray, curing proceeds with radical polymerization. When oxygen coexists during polymerization, a radical producing compound and oxygen react to suppress the polymerization reaction. When the polymerization reaction is suppressed, and unreacted portions remain in the photosensitive resin layer, the shape of the eventually formed pattern has a curved portion at the end. On the other hand, when the amount of coexisting oxygen during ultraviolet curing is reduced, the polymerization reaction is less likely to be suppressed, and the shape of the eventually formed pattern has a planar portion at the end. Therefore, when attempting to prepare a pattern having a flat portion at the end, it is effective to reduce the amount of oxygen.

When providing an oxygen inhibiting layer between the photosensitive resin layer and the ablation layer in order to reduce the amount of oxygen in the photosensitive resin layer, the oxygen permeability of the oxygen inhibiting layer is preferably 4000 cc·20 μm/m²·24 hr·atm or less, more preferably 3000 cc·20 μm/m²·24 hr·atm or less, and further preferably 2000 cc·20 μm/m²·24 hr·atm or less.

From the viewpoint of process simplicity, it is preferable that the oxygen inhibiting layer can be washed with the same washing solution as the ablation layer and/or the photosensitive resin layer. From this viewpoint, the oxygen inhibiting layer is preferably water-soluble or alkali-soluble, and more preferably soluble in a solution containing water in an amount of at least 50% by mass.

In order to satisfy the above numerical range of oxygen permeability, the oxygen inhibiting layer is preferably formed of at least one selected from the group consisting of polyvinyl alcohol, partially saponified polyvinyl acetate, a partially saponified poly(ethylene oxide vinyl acetate) graft copolymer, and a water-soluble poly(ethylene-vinyl alcohol) copolymer. In particular, polyvinyl alcohol and/or partially saponified polyvinyl acetate having excellent oxygen inhibiting properties is preferable.

In general, polyvinyl alcohol and/or partially saponified polyvinyl acetate has high oxygen inhibiting properties because the free volume of the polymer chain is small, and has high affinity with water. The higher the degree of saponification, the higher the oxygen inhibiting properties. On the other hand, an excessively high degree of saponification results in impaired affinity with water and thus strong hydrophobicity. From the above viewpoints, while the degree of saponification can be suitably selected according to the desired properties, the degree of saponification in consideration of the balance between oxygen inhibiting properties and water solubility is preferably 40 mol % or more and 90 mol % or less, more preferably 50 mol % or more and 85 mol % or less, and further preferably 65 mol % or more and 80 mol % or less.

As for the thickness of the oxygen inhibiting layer, the thicker the oxygen inhibiting layer, the greater the oxygen inhibitory effect, but, on the other hand, ultraviolet rays irradiated onto the photosensitive resin layer are absorbed, and polymerization is inhibited. In consideration of their balance, the thickness of the oxygen inhibiting layer is preferably 0.1 μm or more and 100 μm or less, more preferably 0.5 μm or more and 20 μm or less, and more preferably 1 μm or more and 10 μm or less.

When the ablation layer and the oxygen inhibiting layer are both moisture absorbable, the eventually formed pattern shape has unevenness for the following reason.

When preparing the ablation layer, the ablation layer is formed into an aqueous solution or dispersion and cast onto the oxygen inhibiting layer, and therefore the oxygen inhibiting layer is partially eluted, and the oxygen inhibiting layer becomes nonuniform. The nonuniform oxygen inhibiting layer has an uneven oxygen inhibitory effect, and therefore the eventually formed pattern shape also has unevenness. Moreover, when the ablation layer is wrinkled due to moisture absorption, wrinkles are also transferred to the oxygen inhibiting layer, similarly resulting in an uneven pattern shape.

On the other hand, when the ablation layer is composed solely of components that have no affinity with the oxygen inhibiting layer, adhesion between the ablation layer and the oxygen inhibiting layer is impaired, and peeling at the interface between the ablation layer and the oxygen inhibiting layer likely occurs.

The ablation layer of the present embodiment has low moisture absorbability, is highly polar due to the acid-modified polymer, and has high affinity with the high-polarity oxygen inhibiting layer in which polyvinyl alcohol and/or partially saponified polyvinyl acetate is used, and therefore adhesion is increased, and problems as described above can be effectively suppressed.

When the oxygen inhibiting layer is water-soluble, moisture absorption occurs on the oxygen inhibiting layer side, but as long as the ablation layer does not produce wrinkles resulting from moisture absorption, wrinkles are also not produced on the oxygen inhibiting layer, and influence on processing accuracy is negligible.

The method for preparing the oxygen inhibiting layer is not particularly limited, and, for example, the oxygen inhibiting layer may be prepared by bringing the oxygen inhibiting layer into a solution state, coating the photosensitive resin layer with the solution, and drying the solution, or may be prepared on the photosensitive resin layer by a sputtering method. From the viewpoint of process simplicity, a method is preferable in which the oxygen inhibiting layer is brought into a solution state and then coated.

The thickness of the photosensitive resin structure of the present embodiment is not particularly limited, and can be, for example, 0.5 mm to 10 mm.

The photosensitive resin structure of the present embodiment can be produced by, for example, forming the ablation layer on a cover film, firmly adhering the ablation layer-formed surface side to the photosensitive resin layer side that is lamination-formed on a support, and laminating them.

When the oxygen inhibiting layer is formed on the photosensitive resin layer, the photosensitive resin structure can be produced by firmly adhering the oxygen inhibiting layer side of the photosensitive resin layer and the oxygen inhibiting layer that are laminated on a support to the ablation layer-formed surface side, and laminating them.

The cover film is peeled off from the ablation layer before the step of pattern-drawing by irradiation of an infrared ray, which will be described below.

[Method for Producing Relief Printing Plate]

The method for producing a relief printing plate of the present embodiment includes the steps of irradiating a photosensitive resin structure for a relief printing plate including a support, a photosensitive resin layer disposed on the support, and an ablation layer disposed on the photosensitive resin layer with an ultraviolet ray from the support side; performing pattern drawing processing by irradiating the ablation layer with an infrared ray; exposing a pattern by irradiating the photosensitive resin layer with an ultraviolet ray; and removing the ablation layer and the unexposed photosensitive resin layer by an alkaline developer.

When the photosensitive resin structure of the present embodiment further includes the above-described oxygen inhibiting layer, the photosensitive resin layer is irradiated with an ultraviolet ray through the oxygen inhibiting layer in the ultraviolet irradiation step after pattern drawing processing on the ablation layer, and then the ablation layer, the oxygen inhibiting layer, and the unexposed photosensitive resin layer are removed by the alkaline developer.

Thereafter, a step of post-exposure treatment is carried out as necessary, and thus a plate (a relief printing plate) made of a cured product of the photosensitive resin layer can be obtained.

From the viewpoint of imparting peelability, the surface of the printing plate may be brought into contact with a liquid containing a silicone compound and/or a fluorine compound.

The step of ultraviolet irradiation from the support side can be carried out using a commonly used irradiation unit.

As an ultraviolet ray, an ultraviolet ray having a wavelength of 150 to 500 nm can be used, and, in particular, the ultraviolet ray having a wavelength of 300 to 400 nm can be preferably used.

As a light source, for example, a low pressure mercury lamp, a high pressure mercury lamp, an ultrahigh pressure mercury lamp, a metal halide lamp, a xenon lamp, a zirconium lamp, a carbon arc lamp, a fluorescent lamp for ultraviolet rays, and the like can be used.

The step of ultraviolet irradiation may be carried out before the step of pattern drawing processing on the ablation layer or may be carried out after the step of pattern drawing processing.

When the photosensitive resin structure has a cover film, the cover film is peeled off first.

Thereafter, the ablation layer is pattern-irradiated with an infrared ray to form a mask on the photosensitive resin layer.

Examples of suitable infrared lasers include a ND/YAG laser (e.g., 1064 nm) and a diode laser (e.g., 830 nm).

A laser system appropriate for CTP plate making technology is commercially available, and, for example, diode laser system CDI Spark (ESKO GRAPHICS) can be used.

This laser system includes a rotary cylindrical drum for holding a printing original plate, an IR laser irradiating device, and a layout computer, and image information is directly transmitted from the layout computer to the laser device.

As described above, after pattern drawing, the entire surface of the photosensitive resin layer is irradiated with an ultraviolet ray through a mask.

This can be done, with the plate being attached to the laser cylinder, but generally the plate is removed from the laser device, and the surface is irradiated using a commonly used irradiation unit.

As for the irradiation unit, a unit similar to the unit used for ultraviolet irradiation from the support side can be used.

When the photosensitive resin structure of the present embodiment has an oxygen inhibiting layer, and the amount of ultraviolet rays absorbed by the oxygen inhibiting layer is large and is not negligible in the pattern exposing step, it is preferable to suitably adjust the amount of ultraviolet rays to be irradiated by taking the amount of ultraviolet rays that will be absorbed by the oxygen inhibiting layer into consideration beforehand.

Next, the development step is carried out.

In the development step, a conventionally known method is applicable.

Specific examples thereof include a method in which the photosensitive resin structure is exposed as described above, then immersed in a developer, and an unexposed portion is dissolved or scraped off with a brush or the like; and a method in which a developer is caused to act on the plate surface by spraying or the like, and then an unexposed portion is dissolved or scraped off with a brush or the like.

As the developer, a conventionally known alkaline aqueous solution can be used.

The developer contains a pH adjuster.

The pH adjuster may be either an organic material or an inorganic material, and is preferably a material capable of adjusting the pH to 9 or more. Examples of the pH adjuster include, but are not limited to, sodium hydroxide, sodium carbonate, potassium carbonate, sodium silicate, sodium metasilicate, and sodium succinate.

A surfactant can be suitably used in the developer.

Examples of the surfactant include anionic surfactants, amphoteric surfactants, and nonionic surfactants. One of these may be used singly, or two or more may be used in combination.

Examples of the anionic surfactants include, but are not limited to, sulfuric acid ester salts, higher alcohol sulfuric acid esters, higher alkyl ether sulfuric acid ester salts, sulfated olefins, alkylbenzenesulfonic acid salts, α-olefin sulfonic acid salts, phosphoric acid ester salts, and dithiophosphoric acid ester salts.

Examples of the amphoteric surfactant include, but are not limited to, amino acid-type amphoteric surfactants, and betaine-type amphoteric surfactants.

Examples of the nonionic surfactants include, but are not limited to, polyethylene glycol-type surfactants such as higher alcohol ethylene oxide adducts, alkylphenol ethylene oxide adducts, fatty acid ethylene oxide adducts, polyhydric alcohol fatty acid ester ethylene oxide adducts, higher alkylamine ethylene oxide adducts, fatty acid amide ethylene oxide adducts, and polypropylene glycol ethylene oxide adducts; and polyhydric alcohol-type surfactants such as glycerol fatty acid esters, pentaerythritol fatty acid esters, fatty acid esters of sorbitol and sorbitan, alkyl esters of polyhydric alcohols, and fatty acid amides of alkanolamines.

In addition to the above various surfactants, it is a useful method to add to the developer an organic solvent that can be mixed with water, such as alkyl glycol ether, as a penetrant in order to increase developability and increase penetrability of a silicone compound into the plate.

The penetrant can be selected according to the composition of the photosensitive resin composition layer to be developed. Examples of the penetrant include, but are not limited to, mono- or polyethylene glycol ether-type nonionic penetrants such as dibutyl glycol ether.

The concentration of each component of the developer is not particularly limited, and can be suitably adjusted in consideration of time, cost, and the like of development.

The pH adjuster is usually used in the range of 0.1% by mass or more and 10% by mass or less in the developer.

The surfactant is usually used in the range of 1% by mass or more and 50% by mass or less in the developer, and is preferably 3% by mass or more and 20% by mass or less.

The penetrant is usually used in the range of 0.2% by mass or more and 20% by mass or less in the developer, and is preferably in the range of 0.2% by mass or more and 10% by mass or less.

EXAMPLES

Below, the present invention will now be described by way of specific Examples and Comparative Examples, but the present invention is not limited thereto.

[(1) Measurement Methods and Evaluation Methods Used in Examples and Comparative Examples]

((a) Developability Test)

The ablation layers formed on a cover film that were prepared in Examples and Comparative Examples described below were first developed for 10 seconds at room temperature and then further developed for 1 minute using a 0.5% by mass aqueous potassium carbonate solution as a developer.

Evaluations were made on a three-point scale, with ⊚ denoting that the ablation layer was uniformly removed by the first 10-second development, ○ denoting that there was a residual film during the first 10 seconds, but the ablation layer was uniformly removed by the next 1-minute development, and × denoting that the ablation layer remained unevenly even after the 1-minute development and was not uniformly removable.

((b) Over-Time Moisture Absorbability Test)

The moisture absorbability of the ablation layers over time was evaluated by the following method.

The cover film of a sample that had been left to stand for 1 month in an environment having 40° C. and 90% RH was peeled off, the peel strength was measured, and evaluations were made from the peeled state as follows.

⊚ denotes a sample wherein the cover film was peelable with the same peeling weight as the peeling weight immediately after production (a sample having a ratio of the peel strength immediately after production to the peel strength after being left to stand (the peel strength after being left to stand/the peel strength immediately after production) of less than 1.5).

○ denotes a sample wherein the cover film was peelable although the peeling weight was heavier than the peeling weight immediately after production (a sample having a ratio of the peel strength immediately after production to the peel strength after being left to stand (the peel strength after being left to stand/the peel strength immediately after production) of 1.5 or more).

× demotes a sample wherein the peeling weight was heavier than the peeling weight immediately after production, and the ablation layer was partially peeled off together with the cover film.

In the measurement of peel strength, the ablation layers formed on a cover film that were prepared in Examples and Comparative Examples described below were each cut to have 10 cm per side, used as measurement samples, and measured using an autograph AGS-X 100N manufactured by Shimadzu Corporation.

((c) Scratch Resistance Test)

The scratch resistance of the ablation layers was evaluated by the following method.

A Mitsubishi Pencil UNI having a hardness of 2B was attached to a Clemens type Scratch Hardness Tester manufactured by Tester Sangyo Co., Ltd., with the core being exposed, then a load was applied, and the abrasion layers were scratched at a speed of 5 mm/sec. The applied load was increased by 10 g increments, and the load by which a scratch that penetrated the film constituting the ablation layers for the first time was evaluated as scratch resistance.

The above tests (a) and (c) were performed on the laminates of an ablation layer and a cover film, and the above test (b) was performed on the evaluation photosensitive resin structures.

[(2) Method for Producing Laminate of Support and Photosensitive Resin Layer]

A support for a photosensitive resin layer was prepared by the following procedure.

First, 624 g of neopentyl glycol, 93 g of ethylene glycol, 485 g of sebacic acid, and 382 g of isophthalic acid were subjected to a condensation reaction in an air atmosphere at a reaction temperature of 180° C. under a reduced pressure of 10 mmHg for 6 hours.

Thereafter, 87 g of tolylene diisocyanate was added, the mixture was further reacted at 80° C. for 5 hours, and thus a polyol was obtained.

The number average molecular weight of the polyol thus obtained was measured by gel permeation chromatography and was about 32000 in terms of polystyrene.

Next, 100 parts by mass of the polyol, 2 parts by mass of 2-hydroxypropyl methacrylate, 17 parts by mass of a tolylene diisocyanate (3 mol) adduct of trimethylolpropane (1 mol), 5 parts by mass of "Valifast Yellow" (manufactured by Orient Chemical Industries Co., Ltd., a trade name), and 300 parts by mass of ethyl acetate were mixed to obtain a uniform solution.

Next, PET film "A4100" (manufactured by Toyobo Co., Ltd., a trade name) having a film thickness of 125 μm was coated with the above solution using a knife coater such that the amount of coating after drying was 10 to 14 g/m².

This was dried at 80° C. for 2 minutes and then left to stand in a 40° C. atmosphere for 3 days to obtain a support including a urethane adhesive layer.

Next, a method for producing a laminate of the support and a photosensitive resin layer is described below.

The photosensitive resin of a plate-shaped photosensitive resin plate EF (manufactured by Asahi Kasei Chemicals Corporation, trade name AWP) was introduced between the support and an anti-tack film (a PET film coated with a silicone release material) and thermally pressed and shaped using a heat press at 120° C. to a thickness of 1.14 mm to obtain a laminate of a support, a photosensitive resin layer, and an anti-tack film (hereinafter referred to as laminate 1).

Below, Examples and Comparative Examples are shown.

The evaluation results of Examples and Comparative Examples are shown in Table 1.

Example 1

First, 0.5 parts by mass of carboxylic acid-modified acrylic polymer UC-3510 (manufactured by Toagosei Co., Ltd., a trade name, an acid value of 70 mg KOH/g, a glass transition temperature of −50° C., a number average molecular weight of 2000) as an acid-modified polymer, 7.3 parts by mass of Black Dispersion (2) (manufactured by Showa Ink Manufacturing Co., Ltd., a trade name, a dispersion of 40% by mass of carbon black and 7.5% by mass of a dispersing agent) as a dispersion of infrared-absorbing agent carbon black, 1.3 parts by mass of Tuftec H1051 (manufactured by Asahi Kasei Corporation, a registered trade name, a styrene content of 42% by mass) as a hydrogenated product of a styrene-butadiene-styrene elastomer, 0.4 parts by mass of KF-351 (manufactured by Shin-Etsu Chemical Co., Ltd., a trade name) as a silicone resin, and 44 parts by mass of toluene were mixed to obtain a coating solution for ablation layer formation.

Lumirror X53 (manufactured by Toray Advanced Film Co., Ltd., a registered trade name) having a thickness of 100 μm as a cover film was coated with the coating solution for ablation layer formation such that the film thickness after drying was 3 μm, and subjected to a drying treatment at 90° C. for 2 minutes to obtain a laminate of an ablation layer and a cover film. The layer acid value was 6.2 mg KOH/g. The neutralized salt ratio was 0.01.

Then, the anti-tack film of laminate 1 prepared above was peeled off.

Thereafter, laminate 1 was laminated at 120° C. on the laminate of an ablation layer and a cover film obtained above such that the ablation layer was in contact with the photosensitive resin layer, to prepare an evaluation photosensitive resin structure.

The ablation layer of the photosensitive resin structure prepared in Example 1 showed good alkali developability. Scratch resistance was 10 g. Moisture absorbability over time was low, and it was possible to peel off the ablation layer without a problem. When a printing pattern was prepared using the evaluation photosensitive resin structure, a pattern having a curved portion at the end (a pattern wherein the top shape was curved) was obtained.

Example 2

First, 0.5 parts by mass of carboxylic acid-modified acrylic polymer UC-3000 (manufactured by Toagosei Co., Ltd., a trade name, an acid value of 74 mg KOH/g, a glass transition temperature of 65° C., a number average molecular weight of 10000) as an acid-modified polymer, 7.3 parts by mass of Black Dispersion (2) (manufactured by Showa Ink Manufacturing Co., Ltd., a trade name, a dispersion of 40% by mass of carbon black and 7.5% by mass of a dispersing agent) as a dispersion of infrared-absorbing agent carbon black, 1.3 parts by mass of Tuftec H1051 (manufactured by Asahi Kasei Corporation, a registered trade name, a styrene content of 42% by mass) as a hydrogenated product of a styrene-butadiene-styrene elastomer, 0.4 parts by mass of KF-351 (manufactured by Shin-Etsu Chemical Co., Ltd., a trade name) as a silicone resin, 39 parts by mass of toluene, and 9 parts by mass of ethyl acetate were mixed to obtain a coating solution for ablation layer formation.

Lumirror X53 (manufactured by Toray Advanced Film Co., Ltd., a registered trade name) having a thickness of 100 μm as a cover film was coated with the coating solution for ablation layer formation such that the film thickness after drying was 3 μm, and subjected to a drying treatment at 90° C. for 2 minutes to obtain a laminate of an ablation layer and a cover film. The layer acid value was 6.5 mg KOH/g. The neutralized salt ratio was 0.005.

Then, the anti-tack film of laminate 1 prepared above was peeled off.

Thereafter, laminate 1 was laminated at 120° C. on the laminate of an ablation layer and a cover film obtained above such that the ablation layer was in contact with the photosensitive resin layer, to prepare an evaluation photosensitive resin structure.

The ablation layer of the photosensitive resin structure prepared in Example 2 showed good alkali developability. Scratch resistance was 10 g. Moisture absorbability over time was low, and it was possible to peel off the ablation layer without a problem. When a printing pattern was prepared using the evaluation photosensitive resin structure, a pattern having a curved portion at the end (a pattern wherein the top shape was curved) was obtained.

Example 3

First, 0.5 parts by mass of carboxylic acid-modified acrylic polymer UC-3510 (manufactured by Toagosei Co., Ltd., a trade name, an acid value of 70 mg KOH/g, a glass transition temperature of −50° C., a number average molecular weight of 2000) as an acid-modified polymer, 7.3 parts by mass of Black Dispersion (2) (manufactured by Showa Ink Manufacturing Co., Ltd., a trade name, a dispersion of 40% by mass of carbon black and 7.5% by mass of a dispersing agent) as a dispersion of infrared-absorbing agent carbon black, and 44 parts by mass of toluene were mixed to obtain a coating solution for ablation layer formation.

Unipeel TR1 (manufactured by Unitika Ltd., a registered trade name) having a thickness of 100 μm as a cover film was coated with the coating solution for ablation layer formation such that the film thickness after drying was 3 μm, and subjected to a drying treatment at 90° C. for 2 minutes to obtain a laminate of an ablation layer and a cover film. The layer acid value was 8.8 mg KOH/g. The neutralized salt ratio was 0.01.

Then, the anti-tack film of laminate 1 prepared above was peeled off.

Thereafter, laminate 1 was laminated at 120° C. on the laminate of an ablation layer and a cover film obtained above such that the ablation layer was in contact with the photosensitive resin layer, to prepare an evaluation photosensitive resin structure.

The ablation layer of the photosensitive resin structure prepared in Example 3 showed good alkali developability. Scratch resistance was 10 g. Moisture absorbability over time was low, and it was possible to peel off the ablation layer without a problem. When a printing pattern was prepared using the evaluation photosensitive resin structure, a pattern having a curved portion at the end (a pattern wherein the top shape was curved) was obtained.

Example 4

First, 1.5 parts by mass of carboxylic acid-modified acrylic polymer (ACA)Z250 (manufactured by Daicel-Allnex Ltd., a trade name, an acid value of 69 mg KOH/g, a glass transition temperature of 136° C., a number average molecular weight of 22000, a 55% solution) as an acid-modified polymer, 7.3 parts by mass of Black Dispersion (1) (manufactured by Showa Ink Manufacturing Co., Ltd., a trade name, a dispersion of 40% by mass of carbon black and 7.5% by mass of a dispersing agent) as a dispersion of infrared-absorbing agent carbon black, and 44 parts by mass of propylene glycol monomethyl ether were mixed to obtain a coating solution for ablation layer formation.

Unipeel TR1 (manufactured by Unitika Ltd., a registered trade name) having a thickness of 100 μm as a cover film was coated with the coating solution for ablation layer formation such that the film thickness after drying was 3 μm, and subjected to a drying treatment at 90° C. for 2 minutes to obtain a laminate of an ablation layer and a cover film. The layer acid value was 20.8 mg KOH/g. The neutralized salt ratio was 0.02.

Then, the anti-tack film of laminate 1 prepared above was peeled off.

Thereafter, laminate 1 was laminated at 120° C. on the laminate of an ablation layer and a cover film obtained above such that the ablation layer was in contact with the photosensitive resin layer, to prepare an evaluation photosensitive resin structure.

The ablation layer of the photosensitive resin structure prepared in Example 4 showed very good alkali developability. Scratch resistance was 10 g. Moisture absorbability over time was low, and it was possible to peel off the ablation layer without a problem. When a printing pattern was prepared using the evaluation photosensitive resin structure, a pattern having a curved portion at the end (a pattern wherein the top shape was curved) was obtained.

Example 5

First, 0.5 parts by mass of carboxylic acid-modified acrylic polymer UC-3510 (manufactured by Toagosei Co., Ltd., a trade name, an acid value of 70 mg KOH/g, a glass transition temperature of −50° C., a number average molecular weight of 2000) and 0.5 parts by mass of (ACA)Z250 (manufactured by Daicel-Allnex Ltd., a trade name, an acid value of 69 mg KOH/g, a glass transition temperature of 136° C., a number average molecular weight of 22000, a 55% solution) as acid-modified polymers, 7.3 parts by mass of Black Dispersion (1) (manufactured by Showa Ink Manufacturing Co., Ltd., a trade name, a dispersion of 40% by mass of carbon black and 7.5% by mass of a dispersing agent) as a dispersion of infrared-absorbing agent carbon black, and 44 parts by mass of propylene glycol monomethyl ether were mixed to obtain a coating solution for ablation layer formation.

Unipeel TR1 (manufactured by Unitika Ltd., a registered trade name) having a thickness of 100 μm as a cover film was coated with the coating solution for ablation layer formation such that the film thickness after drying was 3 μm, and subjected to a drying treatment at 90° C. for 2 minutes to obtain a laminate of an ablation layer and a cover film. The layer acid value was 15.6 mg KOH/g. The neutralized salt ratio was 0.02.

Then, the anti-tack film of laminate 1 prepared above was peeled off.

Thereafter, laminate 1 was laminated at 120° C. on the laminate of an ablation layer and a cover film obtained above such that the ablation layer was in contact with the photosensitive resin layer, to prepare an evaluation photosensitive resin structure.

The ablation layer of the photosensitive resin structure prepared in Example 5 showed very good alkali developability. Scratch resistance was 10 g. Moisture absorbability over time was low, and it was possible to peel off the ablation layer without a problem. When a printing pattern was prepared using the evaluation photosensitive resin structure, a pattern having a curved portion at the end (a pattern wherein the top shape was curved) was obtained.

Example 6

First, 2.0 parts by mass of carboxylic acid-modified acrylic polymer UC-3510 (manufactured by Toagosei Co., Ltd., a trade name, an acid value of 70 mg KOH/g, a glass transition temperature of −50° C., a number average molecular weight of 2000) as an acid-modified polymer, 7.3 parts by mass of Black Dispersion (2) (manufactured by Showa Ink Manufacturing Co., Ltd., a trade name, a dispersion of 40% by mass of carbon black and 7.5% by mass of a dispersing agent) as a dispersion of infrared-absorbing agent carbon black, 1.3 parts by mass of Tuftec H1043 (manufactured by Asahi Kasei Corporation, a registered trade name, a styrene content of 70% by mass) as a hydrogenated product of a styrene-butadiene-styrene elastomer, and 44 parts by mass of toluene were mixed to obtain a coating solution for ablation layer formation.

Unipeel TR1 (manufactured by Unitika Ltd., a registered trade name) having a thickness of 100 μm as a cover film was coated with the coating solution for ablation layer formation such that the film thickness after drying was 3 μm, and subjected to a drying treatment at 90° C. for 2 minutes to obtain a laminate of an ablation layer and a cover film. The layer acid value was 20.7 mg KOH/g. The neutralized salt ratio was 0.01.

Then, the anti-tack film of laminate 1 prepared above was peeled off.

Thereafter, laminate 1 was laminated at 120° C. on the laminate of an ablation layer and a cover film obtained above such that the ablation layer was in contact with the photosensitive resin layer, to prepare an evaluation photosensitive resin structure.

The ablation layer of the photosensitive resin structure prepared in Example 6 showed very good alkali developability. Scratch resistance was 10 g. Moisture absorbability over time was low, and it was possible to peel off the ablation layer without a problem. When a printing pattern was prepared using the evaluation photosensitive resin structure, a pattern having a curved portion at the end (a pattern wherein the top shape was curved) was obtained.

Example 7

First, 0.5 parts by mass of carboxylic acid-modified acrylic polymer UC-3510 (manufactured by Toagosei Co., Ltd., a trade name, an acid value of 70 mg KOH/g, a glass transition temperature of −50° C., a number average molecular weight of 2000) as an acid-modified polymer, 2.5 parts by mass of Black Dispersion (2) (manufactured by Showa Ink Manufacturing Co., Ltd., a trade name, a dispersion of 40% by mass of carbon black and 7.5% by mass of a dispersing agent) as a dispersion of infrared-absorbing agent carbon black, 1.0 parts by mass of Tuftec H1051 (manufactured by Asahi Kasei Corporation, a registered trade name, a styrene content of 42% by mass) as a hydrogenated product of a styrene-butadiene-styrene elastomer, 0.2 parts by mass of KF-351 (manufactured by Shin-Etsu Chemical Co., Ltd., a trade name) as a silicone resin, and 44 parts by mass of toluene were mixed to obtain a coating solution for ablation layer formation.

Lumirror X53 (manufactured by Toray Advanced Film Co., Ltd., a registered trade name) having a thickness of 100 μm as a cover film was coated with the coating solution for ablation layer formation such that the film thickness after drying was 3 μm, and subjected to a drying treatment at 90° C. for 2 minutes to obtain a laminate of an ablation layer and a cover film. The layer acid value was 12.1 mg KOH/g. The neutralized salt ratio was 0.01.

Then, the anti-tack film of laminate 1 prepared above was peeled off.

Thereafter, laminate 1 was laminated at 120° C. on the laminate of an ablation layer and a cover film obtained above such that the ablation layer was in contact with the photosensitive resin layer, to prepare an evaluation photosensitive resin structure.

The ablation layer of the photosensitive resin structure prepared in Example 7 showed very good alkali developability. Scratch resistance was 10 g. Moisture absorbability over time was low, and it was possible to peel off the ablation layer without a problem. When a printing pattern was prepared using the evaluation photosensitive resin structure, a pattern having a curved portion at the end (a pattern wherein the top shape was curved) was obtained.

Example 8

First, 2.0 parts by mass of phosphoric acid group-containing acrylic polymer PP-401 (manufactured by DAP, a trade name, an acid value of 244 mg KOH/g) as an acid-modified polymer, 7.3 parts by mass of Black Dispersion (1) (manufactured by Showa Ink Manufacturing Co., Ltd., a trade name, a dispersion of 40% by mass of carbon black and 7.5% by mass of a dispersing agent) as a dispersion of infrared-absorbing agent carbon black, and 44 parts by mass of 2-propanol were mixed to obtain a coating solution for ablation layer formation.

Unipeel TR1 (manufactured by Unitika Ltd., a registered trade name) having a thickness of 100 μm as a cover film was coated with the coating solution for ablation layer formation such that the film thickness after drying was 3 μm, and subjected to a drying treatment at 90° C. for 2 minutes to obtain a laminate of an ablation layer and a cover film. The layer acid value was 89.3 mg KOH/g. The neutralized salt ratio was 0.1.

Then, the anti-tack film of laminate 1 prepared above was peeled off.

Thereafter, laminate 1 was laminated at 120° C. on the laminate of an ablation layer and a cover film obtained above such that the ablation layer was in contact with the photosensitive resin layer, to prepare an evaluation photosensitive resin structure.

The ablation layer of the photosensitive resin structure prepared in Example 8 showed very good alkali developability. Scratch resistance was 10 g. Moisture absorbability over time was low, and it was possible to peel off the ablation layer without a problem. When a printing pattern was prepared using the evaluation photosensitive resin structure, a pattern having a curved portion at the end (a pattern wherein the top shape was curved) was obtained.

Example 9

First, 0.5 parts by mass of carboxylic acid-modified acrylic polymer UC-3510 (manufactured by Toagosei Co., Ltd., a trade name, an acid value of 70 mg KOH/g, a glass transition temperature of −50° C., a number average molecular weight of 2000) as an acid-modified polymer, 7.3 parts by mass of Black Dispersion (2) (manufactured by Showa Ink Manufacturing Co., Ltd., a trade name, a dispersion of 40% by mass of carbon black and 7.5% by mass of a dispersing agent) as a dispersion of infrared-absorbing agent carbon black, 1.3 parts by mass of Tuftec H1051 (manufactured by Asahi Kasei Corporation, a registered trade name, a styrene content of 42% by mass) as a hydrogenated product of a styrene-butadiene-styrene elastomer, 0.5 parts by mass of RV-23 (manufactured by Gifu Shellac Manufacturing Co., Ltd., a trade name), 0.4 parts by mass of KF-351 (manufactured by Shin-Etsu Chemical Co., Ltd., a trade name) as a silicone resin, and 44 parts by mass of toluene were mixed to obtain a coating solution for ablation layer formation.

Lumirror X53 (manufactured by Toray Advanced Film Co., Ltd., a registered trade name) having a thickness of 100 μm as a cover film was coated with the coating solution for ablation layer formation such that the film thickness after drying was 3 μm, and subjected to a drying treatment at 90° C. for 2 minutes to obtain a laminate of an ablation layer and a cover film. The layer acid value was 5.7 mg KOH/g. The neutralized salt ratio was 0.01.

Then, the anti-tack film of laminate 1 prepared above was peeled off.

Thereafter, laminate 1 was laminated at 120° C. on the laminate of an ablation layer and a cover film obtained above such that the ablation layer was in contact with the photosensitive resin layer, to prepare an evaluation photosensitive resin structure.

The ablation layer of the photosensitive resin structure prepared in Example 9 showed good alkali developability. Scratch resistance was 30 g. Moisture absorbability over time was low, and it was possible to peel off the ablation layer without a problem. When a printing pattern was prepared using the evaluation photosensitive resin structure, a pattern having a curved portion at the end (a pattern wherein the top shape was curved) was obtained.

Example 10

First, 0.5 parts by mass of carboxylic acid-modified acrylic polymer UC-3000 (manufactured by Toagosei Co., Ltd., a trade name, an acid value 74 mg KOH/g, a glass transition temperature of 65° C., a number average molecular weight of 10000) as an acid-modified polymer, 7.3 parts by mass of Black Dispersion (2) (manufactured by Showa Ink Manufacturing Co., Ltd., a trade name, a dispersion of 40% by mass of carbon black and 7.5% by mass of a dispersing agent) as a dispersion of infrared-absorbing agent carbon black, 1.3 parts by mass of Tuftec H1051 (manufactured by Asahi Kasei Corporation, a registered trade name, a styrene content of 42% by mass) as a hydrogenated product of a styrene-butadiene-styrene elastomer, 0.5 parts by mass of RU-30 (manufactured by Gifu Shellac Manufacturing Co., Ltd., a trade name), 0.4 parts by mass of KF-351 (manufactured by Shin-Etsu Chemical Co., Ltd., a trade name) as a silicone resin, and 44 parts by mass of toluene were mixed to obtain a coating solution for ablation layer formation.

Lumirror X53 (manufactured by Toray Advanced Film Co., Ltd., a registered trade name) having a thickness of 100 μm as a cover film was coated with the coating solution for ablation layer formation such that the film thickness after drying was 3 μm, and subjected to a drying treatment at 90° C. for 2 minutes to obtain a laminate of an ablation layer and a cover film. The layer acid value was 6.0 mg KOH/g. The neutralized salt ratio was 0.005.

Then, the anti-tack film of laminate 1 prepared above was peeled off.

Thereafter, laminate 1 was coated with a polyvinyl alcohol solution consisting of 1 part by mass of Gohsenol GH-22 (manufactured by Nippon Synthetic Chemical Industry Co., Ltd., a trade name, a degree of saponification of 87 mol %), 20 parts by mass of water, and 10 parts by mass of ethanol so as to have a film thickness of 1 μm, and dried.

Moreover, laminate 1 was laminated at 120° C. on the laminate of an ablation layer and a cover film obtained above such that the ablation layer was in contact with the photosensitive resin layer, to prepare an evaluation photosensitive resin structure.

The ablation layer of the photosensitive resin structure prepared in Example 10 showed good alkali developability. Scratch resistance was 30 g. Moisture absorbability over time was low, and it was possible to peel off the ablation layer without a problem. When a printing pattern was prepared using the evaluation photosensitive resin structure, a pattern having a planar portion at the end (a pattern wherein the top shape was flat) was obtained.

Example 11

First, 1.3 parts by mass of carboxylic acid-modified acrylic polymer UC-3510 (manufactured by Toagosei Co., Ltd., a trade name, an acid value 70 mg KOH/g, a glass transition temperature of −50° C., a number average molecular weight of 2000) as an acid-modified polymer, 10 parts by mass of Black Dispersion (2) (manufactured by Showa Ink Manufacturing Co., Ltd., a trade name, a dispersion of 40% by mass of carbon black and 7.5% by mass of a dispersing agent) as a dispersion of infrared-absorbing agent carbon black, 4.0 parts by mass of Tuftec H1051 (manufactured by Asahi Kasei Corporation, a registered trade name, a styrene content of 42% by mass) as a hydrogenated product of a styrene-butadiene-styrene elastomer, 2.0 parts by mass of RV-23 (manufactured by Gifu Shellac Manufacturing Co., Ltd., a trade name), 0.2 parts by mass of KF-351 (manufactured by Shin-Etsu Chemical Co., Ltd., a trade name) as a silicone resin, and 100 parts by mass of toluene were mixed to obtain a coating solution for ablation layer formation.

Lumirror X53 (manufactured by Toray Advanced Film Co., Ltd., a registered trade name) having a thickness of 100 μm as a cover film was coated with the coating solution for ablation layer formation such that the film thickness after drying was 3 μm, and subjected to a drying treatment at 90° C. for 2 minutes to obtain a laminate of an ablation layer and a cover film. The layer acid value was 7.4 mg KOH/g. The neutralized salt ratio was 0.01.

Then, the anti-tack film of laminate 1 prepared above was peeled off.

Thereafter, laminate 1 was coated with a polyvinyl alcohol solution consisting of 1 part by mass of Gohsenol KH-17 (manufactured by Nippon Synthetic Chemical Industry Co., Ltd., a trade name, a degree of saponification of 80 mol %), 20 parts by mass of water, and 10 parts by mass of ethanol so as to have a film thickness of 0.2 μm, and dried.

Moreover, laminate 1 was laminated at 120° C. on the laminate of an ablation layer and a cover film obtained above such that the ablation layer was in contact with the photosensitive resin layer, to prepare an evaluation photosensitive resin structure.

The ablation layer of the photosensitive resin structure prepared in Example 1 showed good alkali developability. Scratch resistance was 110 g. Moisture absorbability over time was low, and it was possible to peel off the ablation layer without a problem. When a printing pattern was prepared using the evaluation photosensitive resin structure, a pattern having a planar portion at the end and a curved portion at the edge (a pattern wherein the top shape was flat, and the edge shape was curved) was obtained.

Example 12

First, 2.0 parts by mass of carboxylic acid-modified acrylic polymer UC-3510 (manufactured by Toagosei Co., Ltd., a trade name, an acid value of 70 mg KOH/g, a glass transition temperature of −50° C., a number average molecular weight of 2000) as an acid-modified polymer, 2.0 parts by mass of nickel-dithiolene complex B4360 (manufactured by Tokyo Chemical Industry Co., Ltd., a trade name) as an infrared-absorbing agent, 1.3 parts by mass of Tuftec H1051 (manufactured by Asahi Kasei Corporation, a registered trade name, a styrene content of 42% by mass) as a hydrogenated product of a styrene-butadiene-styrene elastomer, 0.4 parts by mass of KF-351 (manufactured by Shin-Etsu Chemical Co., Ltd., a trade name) as a silicone resin, and 44 parts by mass of toluene were mixed to obtain a coating solution for ablation layer formation.

Lumirror X53 (manufactured by Toray Advanced Film Co., Ltd., a registered trade name) having a thickness of 100 μm as a cover film was coated with the coating solution for ablation layer formation such that the film thickness after drying was 3 μm, and subjected to a drying treatment at 90° C. for 2 minutes to obtain a laminate of an ablation layer and a cover film. The layer acid value was 24.6 mg KOH/g. The neutralized salt ratio was 0.01.

Then, the anti-tack film of laminate 1 prepared above was peeled off.

Thereafter, laminate 1 was laminated at 120° C. on the laminate of an ablation layer and a cover film obtained above such that the ablation layer was in contact with the photosensitive resin layer, to prepare an evaluation photosensitive resin structure.

The ablation layer of the photosensitive resin structure prepared in Example 12 showed very good alkali developability. Scratch resistance was 10 g. Moisture absorbability over time was low, and it was possible to peel off the ablation layer without a problem. When a printing pattern was prepared using the evaluation photosensitive resin structure, a pattern having a curved portion at the end (a pattern wherein the top shape was curved) was obtained.

Example 13

First, 1 part by mass of triethylamine was added to 100 parts by mass of carboxylic acid-modified acrylic polymer UC-3510 (manufactured by Toagosei Co., Ltd., a trade name, an acid value of 70 mg KOH/g, a glass transition temperature of −50° C., a number average molecular weight of 2000) to partially neutralize the carboxylic acid of UC-3510.

Next, 0.5 parts by mass of UC-3510 neutralized above, 7.3 parts by mass of Black Dispersion (2) (manufactured by Showa Ink Manufacturing Co., Ltd., a trade name, a dispersion of 40% by mass of carbon black and 7.5% by mass of a dispersing agent) as a dispersion of infrared-absorbing agent carbon black, 1.3 parts by mass of Tuftec H1051 (manufactured by Asahi Kasei Corporation, a registered trade name, a styrene content of 42% by mass) as a hydrogenated product of a styrene-butadiene-styrene elastomer, 0.4 parts by mass of KF-351 (manufactured by Shin-Etsu Chemical Co., Ltd., a trade name) as a silicone resin, and 44 parts by mass of toluene were mixed to obtain a coating solution for ablation layer formation.

Lumirror X53 (manufactured by Toray Advanced Film Co., Ltd., a registered trade name) having a thickness of 100 μm as a cover film was coated with the coating solution for ablation layer formation such that the film thickness after drying was 3 μm, and subjected to a drying treatment at 90° C. for 2 minutes to obtain a laminate of an ablation layer and a cover film. The layer acid value was 6.2 mg KOH/g. The neutralized salt ratio was 0.15.

Then, the anti-tack film of laminate 1 prepared above was peeled off.

Thereafter, laminate 1 was laminated at 120° C. on the laminate of an ablation layer and a cover film obtained above such that the ablation layer was in contact with the photosensitive resin layer, to prepare an evaluation photosensitive resin structure.

The ablation layer of the photosensitive resin structure prepared in Example 13 showed good alkali developability. Scratch resistance was 10 g. Moisture absorbability over time was low, and it was possible to peel off the ablation layer without a problem. When a printing pattern was prepared using the evaluation photosensitive resin structure, a pattern having a curved portion at the end (a pattern wherein the top shape was curved) was obtained.

Example 14

First, 2 parts by mass of triethylamine was added to 100 parts by mass of carboxylic acid-modified acrylic polymer UC-3000 (manufactured by Toagosei Co., Ltd., a trade name, an acid value of 74 mg KOH/g, a glass transition temperature of 65° C., a number average molecular weight of 10000) to partially neutralize the carboxylic acid of UC-3000.

Next, 0.5 parts by mass of UC-3000 neutralized above, 7.3 parts by mass of Black Dispersion (2) (manufactured by Showa Ink Manufacturing Co., Ltd., a trade name, a dispersion of 40% by mass of carbon black and 7.5% by mass of a dispersing agent) as a dispersion of infrared-absorbing agent carbon black, 1.3 parts by mass of Tuftec H1051 (manufactured by Asahi Kasei Corporation, a registered trade name, a styrene content of 42% by mass) as a hydrogenated product of a styrene-butadiene-styrene elastomer, 0.4 parts by mass of KF-351 (manufactured by Shin-Etsu Chemical Co., Ltd., a trade name) as a silicone resin, 39 parts by mass of toluene, and 9 parts by mass of ethyl acetate were mixed to obtain a coating solution for ablation layer formation.

Lumirror X53 (manufactured by Toray Advanced Film Co., Ltd., a registered trade name) having a thickness of 100 μm as a cover film was coated with the coating solution for ablation layer formation such that the film thickness after drying was 3 μm, and subjected to a drying treatment at 90° C. for 2 minutes to obtain a laminate of an ablation layer and a cover film. The layer acid value was 6.5 mg KOH/g. The neutralized salt ratio was 0.25.

Then, the anti-tack film of laminate 1 prepared above was peeled off.

Thereafter, laminate 1 was laminated at 120° C. on the laminate of an ablation layer and a cover film obtained above such that the ablation layer was in contact with the photosensitive resin layer, to prepare an evaluation photosensitive resin structure.

The ablation layer of the photosensitive resin structure prepared in Example 14 showed good alkali developability. Scratch resistance was 10 g. Moisture absorbability over time was slightly high, and although the ablation layer did not peel off, peeling was slightly heavy. When a printing pattern was prepared using the evaluation photosensitive resin structure, a pattern having a curved portion at the end (a pattern wherein the top shape was curved) was obtained.

Example 15

First, 6 parts by mass of triethylamine was added to 100 parts by mass of carboxylic acid-modified acrylic polymer UC-3510 (manufactured by Toagosei Co., Ltd., a trade name, an acid value of 70 mg KOH/g, a glass transition temperature of −50° C., a number average molecular weight of 2000) to partially neutralize the carboxylic acid of UC-3510.

Next, 0.5 parts by mass of UC-3510 neutralized above, 7.3 parts by mass of Black Dispersion (2) (manufactured by Showa Ink Manufacturing Co., Ltd., a trade name, a dispersion of 40% by mass of carbon black and 7.5% by mass of a dispersing agent) as a dispersion of infrared-absorbing agent carbon black, 1.3 parts by mass of Tuftec H1051 (manufactured by Asahi Kasei Corporation, a registered trade name, a styrene content of 42% by mass) as a hydrogenated product of a styrene-butadiene-styrene elastomer, 0.4 parts by mass of KF-351 (manufactured by Shin-Etsu Chemical Co., Ltd., a trade name) as a silicone resin, and 44 parts by mass of toluene were mixed to obtain a coating solution for ablation layer formation.

Lumirror X53 (manufactured by Toray Advanced Film Co., Ltd., a registered trade name) having a thickness of 100 μm as a cover film was coated with the coating solution for ablation layer formation such that the film thickness after drying was 3 μm, and subjected to a drying treatment at 90° C. for 2 minutes to obtain a laminate of an ablation layer and a cover film. The layer acid value was 6.2 mg KOH/g. The neutralized salt ratio was 0.82.

Then, the anti-tack film of laminate 1 prepared above was peeled off.

Thereafter, laminate 1 was laminated at 120° C. on the laminate of an ablation layer and a cover film obtained above such that the ablation layer was in contact with the photosensitive resin layer, to prepare an evaluation photosensitive resin structure.

The ablation layer of the photosensitive resin structure prepared in Example 15 showed good alkali developability. Scratch resistance was 10 g. Moisture absorbability over time was high, and although the ablation layer did not peel off, peeling was heavy. When a printing pattern was prepared using the evaluation photosensitive resin structure, a pattern having a curved portion at the end (a pattern wherein the top shape was curved) was obtained.

Example 16

First, 40 parts by mass of acetic acid was added to 100 parts by mass of acid-modified polymer RWU-0018 (manufactured by Sannan Chemical Industry Co., Ltd., a trade name, an acid value of 420 mg KOH/g) to partially bring the neutralized salt of RWU-0018 into an acid state.

Next, 5.0 parts by mass of RWU-0018 brought into an acid state above, 2.0 parts by mass of nickel-dithiolene complex B4360 (manufactured by Tokyo Chemical Industry Co., Ltd., a trade name) as an infrared-absorbing agent, 30 parts by mass of ethyl acetate, and 10 parts by mass of 1-butyl alcohol were mixed to obtain a coating solution for ablation layer formation.

Lumirror X53 (manufactured by Toray Advanced Film Co., Ltd., a registered trade name) having a thickness of 100 μm as a cover film was coated with the coating solution for ablation layer formation such that the film thickness after drying was 3 μm, and subjected to a drying treatment at 90° C. for 2 minutes to obtain a laminate of an ablation layer and a cover film. The layer acid value was 300 mg KOH/g. The neutralized salt ratio was 0.05.

Then, the anti-tack film of laminate 1 prepared above was peeled off.

Thereafter, laminate 1 was laminated at 120° C. on the laminate of an ablation layer and a cover film obtained above such that the ablation layer was in contact with the photosensitive resin layer, to prepare an evaluation photosensitive resin structure.

The ablation layer of the photosensitive resin structure prepared in Example 16 showed very good alkali developability. Scratch resistance was 10 g. Moisture absorbability over time was low, and it was possible to peel off the ablation layer without a problem. When a printing pattern was prepared using the evaluation photosensitive resin structure, a pattern having a curved portion at the end (a pattern wherein the top shape was curved) was obtained.

Example 17

First, 30 parts by mass of acetic acid was added to 100 parts by mass of acid-modified polymer RWU-0018 (manufactured by Sannan Chemical Industry Co., Ltd., a trade name, an acid value of 420 mg KOH/g) to partially bring the neutralized salt of RWU-0018 into an acid state.

Next, 5.0 parts by mass of RWU-0018 brought into an acid state above, 2.0 parts by mass of nickel-dithiolene complex B4360 (manufactured by Tokyo Chemical Industry Co., Ltd., a trade name) as an infrared-absorbing agent, 5.0 parts by mass of Macromelt 6900 (manufactured by Henkel Japan Ltd., a trade name) as a polyamide, 30 parts by mass of toluene, and 10 parts by mass of 1-propyl alcohol were mixed to obtain a coating solution for ablation layer formation.

Lumirror X53 (manufactured by Toray Advanced Film Co., Ltd., a registered trade name) having a thickness of 100 μm as a cover film was coated with the coating solution for ablation layer formation such that the film thickness after drying was 3 μm, and subjected to a drying treatment at 90° C. for 2 minutes to obtain a laminate of an ablation layer and a cover film. The layer acid value was 175 mg KOH/g. The neutralized salt ratio was 0.30.

Then, the anti-tack film of laminate 1 prepared above was peeled off.

Thereafter, laminate 1 was laminated at 120° C. on the laminate of an ablation layer and a cover film obtained above such that the ablation layer was in contact with the photosensitive resin layer, to prepare an evaluation photosensitive resin structure.

The ablation layer of the photosensitive resin structure prepared in Example 17 showed very good alkali developability. Scratch resistance was 10 g. Moisture absorbability over time was high, and although the ablation layer did not peel off, peeling was heavy. When a printing pattern was prepared using the evaluation photosensitive resin structure, a pattern having a curved portion at the end (a pattern wherein the top shape was curved) was obtained.

Example 18

First, 0.5 parts by mass of carboxylic acid-modified acrylic polymer UC-3000 (manufactured by Toagosei Co., Ltd., a trade name, an acid value of 74 mg KOH/g, a glass transition temperature of 65° C., a number average molecular weight of 10000) as an acid-modified polymer, 7.3 parts by mass of Black Dispersion (2) (manufactured by Showa Ink Manufacturing Co., Ltd., a trade name, a dispersion of 40% by mass of carbon black and 7.5% by mass of a dispersing agent) as a dispersion of infrared-absorbing agent carbon black, 1.3 parts by mass of Macromelt 6900 (manufactured by Henkel Japan Ltd., a trade name) as a polyamide, 0.5 parts by mass of RU-30 (manufactured by Gifu Shellac Manufacturing Co., Ltd., a trade name), 0.4 parts by mass of KF-351 (manufactured by Shin-Etsu Chemical Co., Ltd., a trade name) as a silicone resin, and 44 parts by mass of toluene were mixed to obtain a coating solution for ablation layer formation.

Lumirror X53 (manufactured by Toray Advanced Film Co., Ltd., a registered trade name) having a thickness of 100

μm as a cover film was coated with the coating solution for ablation layer formation such that the film thickness after drying was 3 μm, and subjected to a drying treatment at 90° C. for 2 minutes to obtain a laminate of an ablation layer and a cover film. The layer acid value was 6.0 mg KOH/g. The neutralized salt ratio was 0.005.

Then, the anti-tack film of laminate 1 prepared above was peeled off.

Thereafter, laminate 1 was coated with a polyvinyl alcohol solution consisting of 1 part by mass of Gohsenol GH-22 (manufactured by Nippon Synthetic Chemical Industry Co., Ltd., a trade name, a degree of saponification of 87 mol %), 20 parts by mass of water, and 10 parts by mass of ethanol so as to have a film thickness of 1 μm, and dried.

Moreover, laminate 1 was laminated at 120° C. on the laminate of an ablation layer and a cover film obtained above such that the ablation layer was in contact with the photosensitive resin layer, to prepare an evaluation photosensitive resin structure.

The ablation layer of the photosensitive resin structure prepared in Example 18 showed good alkali developability. Scratch resistance was 40 g. Moisture absorbability over time was low, and it was possible to peel off the ablation layer without a problem. When a printing pattern was prepared using the evaluation photosensitive resin structure, a pattern having a planar portion at the end (a pattern wherein the top shape was flat) was obtained.

Comparative Example 1

First, 7.3 parts by mass of Black Dispersion (2) (manufactured by Showa Ink Manufacturing Co., Ltd., a trade name, a dispersion of 40% by mass of carbon black and 7.5% by mass of a dispersing agent) as a dispersion of infrared-absorbing agent carbon black, 1.3 parts by mass of Tuftec H1051 (manufactured by Asahi Kasei Corporation, a registered trade name, a styrene content of 42% by mass) as a hydrogenated product of a styrene-butadiene-styrene elastomer, 0.4 parts by mass of KF-351 (manufactured by Shin-Etsu Chemical Co., Ltd., a trade name) as a silicone resin, and 44 parts by mass of toluene were mixed to obtain a coating solution for ablation layer formation.

Lumirror X53 (manufactured by Toray Advanced Film Co., Ltd., a registered trade name) having a thickness of 100 μm as a cover film was coated with the coating solution for ablation layer formation such that the film thickness after drying was 3 μm, and subjected to a drying treatment at 90° C. for 2 minutes to obtain a laminate of an ablation layer and a cover film. Due to the lack of an acid-modified polymer, the layer acid value was 0 mg KOH/g, and it was not possible to calculate the neutralized salt ratio.

Then, the anti-tack film of laminate 1 prepared above was peeled off.

Thereafter, laminate 1 was laminated at 120° C. on the laminate of an ablation layer and a cover film obtained above such that the ablation layer was in contact with the photosensitive resin layer, to prepare an evaluation photosensitive resin structure.

The ablation layer of the photosensitive resin structure prepared in Comparative Example 1 did not contain an acidic group-containing polymer and therefore did not enable alkali development. Moisture absorbability over time was low, and it was possible to peel off the ablation layer without a problem.

Comparative Example 2

First, 0.1 parts by mass of carboxylic acid-modified acrylic polymer UC-3510 (manufactured by Toagosei Co., Ltd., a trade name, an acid value of 70 mg KOH/g, a glass transition temperature of −50° C., a number average molecular weight of 2000) as an acid-modified polymer, 7.3 parts by mass of Black Dispersion (2) (manufactured by Showa Ink Manufacturing Co., Ltd., a trade name, a dispersion of 40% by mass of carbon black and 7.5% by mass of a dispersing agent) as a dispersion of infrared-absorbing agent carbon black, 1.3 parts by mass of Tuftec H1051 (manufactured by Asahi Kasei Corporation, a registered trade name, a styrene content of 42% by mass) as a hydrogenated product of a styrene-butadiene-styrene elastomer, 0.4 parts by mass of KF-351 (manufactured by Shin-Etsu Chemical Co., Ltd., a trade name) as a silicone resin, and 44 parts by mass of toluene were mixed to obtain a coating solution for ablation layer formation.

Lumirror X53 (manufactured by Toray Advanced Film Co., Ltd., a registered trade name) having a thickness of 100 μm as a cover film was coated with the coating solution for ablation layer formation such that the film thickness after drying was 3 μm, and subjected to a drying treatment at 90° C. for 2 minutes to obtain a laminate of an ablation layer and a cover film. The layer acid value was 1.3 mg KOH/g. The neutralized salt ratio was 0.01.

Then, the anti-tack film of laminate 1 prepared above was peeled off.

Thereafter, laminate 1 was laminated at 120° C. on the laminate of an ablation layer and a cover film obtained above such that the ablation layer was in contact with the photosensitive resin layer, to prepare an evaluation photosensitive resin structure.

The ablation layer of the photosensitive resin structure prepared in Comparative Example 2 had an excessively low layer acid value and therefore did not enable alkali development. Moisture absorbability over time was low, and it was possible to peel off the ablation layer without a problem.

Comparative Example 3

First, 5 parts by mass of polyester resin Vylon 802 (manufactured by Toyobo Co., Ltd., a registered trade name, an acid value of less than 1 mg KOH/g, a glass transition temperature of 60° C., a number average molecular weight of 3000) as a polymer, 7.3 parts by mass of Black Dispersion (2) (manufactured by Showa Ink Manufacturing Co., Ltd., a trade name, a dispersion of 40% by mass of carbon black and 7.5% by mass of a dispersing agent) as a dispersion of infrared-absorbing agent carbon black, 1.3 parts by mass of Tuftec H1051 (manufactured by Asahi Kasei Corporation, a registered trade name, a styrene content of 42% by mass) as a hydrogenated product of a styrene-butadiene-styrene elastomer, 0.4 parts by mass of KF-351 (manufactured by Shin-Etsu Chemical Co., Ltd., a trade name) as a silicone resin, and 44 parts by mass of toluene were mixed to obtain a coating solution for ablation layer formation.

Lumirror X53 (manufactured by Toray Advanced Film Co., Ltd., a registered trade name) having a thickness of 100 μm as a cover film was coated with the coating solution for ablation layer formation such that the film thickness after drying was 3 μm, and subjected to a drying treatment at 90° C. for 2 minutes to obtain a laminate of an ablation layer and a cover film. The layer acid value was less than 0.5 mg KOH/g. The neutralized salt ratio was 0.1.

Then, the anti-tack film of laminate 1 prepared above was peeled off.

Thereafter, laminate 1 was laminated at 120° C. on the laminate of an ablation layer and a cover film obtained above such that the ablation layer was in contact with the photosensitive resin layer, to prepare an evaluation photosensitive resin structure.

The ablation layer of the photosensitive resin structure prepared in Comparative Example 3 had an excessively low layer acid value and therefore did not enable alkali development. Moisture absorbability over time was low, and it was possible to peel off the ablation layer without a problem.

Comparative Example 4

First, 1.0 parts by mass of polyvinyl alcohol GL-05 (manufactured by Nippon Synthetic Chemical Industry Co., Ltd., a trade name, a number average molecular weight of 16000) as a polymer, 7.3 parts by mass of Black Dispersion (1) (manufactured by Showa Ink Manufacturing Co., Ltd., a trade name, a dispersion of 40% by mass of carbon black and 7.5% by mass of a dispersing agent) as a dispersion of infrared-absorbing agent carbon black, and 44 parts by mass of ethanol were mixed to obtain a coating solution for ablation layer formation.

Lumirror X53 (manufactured by Toray Advanced Film Co., Ltd., a registered trade name) having a thickness of 100 μm as a cover film was coated with the coating solution for ablation layer formation such that the film thickness after drying was 3 μm, and subjected to a drying treatment at 90° C. for 2 minutes to obtain a laminate of an ablation layer and a cover film. The layer acid value was 71 mg KOH/g. The neutralized salt ratio was 0.92.

Then, the anti-tack film of laminate 1 prepared above was peeled off.

Thereafter, laminate 1 was laminated at 120° C. on the laminate of an ablation layer and a cover film obtained above such that the ablation layer was in contact with the photosensitive resin layer, to prepare an evaluation photosensitive resin structure.

The ablation layer of the photosensitive resin structure prepared in Comparative Example 4 was water soluble and therefore showed good alkali developability. However, moisture absorbability over time was high, and peeling of the ablation layer was observed.

Comparative Example 5

First, 50 parts by mass of s-caprolactam, 40 parts by mass of N,N-di(γ-aminopropyl)piperazine adipate, 10 parts by mass of 1,3-bisaminomethylcyclohexane adipate, and 100 parts by mass of water were heated under a nitrogen atmosphere in an autoclave. After being pressured and reacted under an internal pressure of 10 kg/cm² for 2 hours, the mixture was reacted for 1 hour under normal pressure to obtain a tertiary nitrogen-containing polyamide.

Next, 3.6 parts by mass of the tertiary nitrogen-containing polyamide synthesized above, 0.3 parts by mass of RWU-0018 (manufactured by Sannan Chemical Industry Co., Ltd., a trade name, an acid value of 420 mg KOH/g) as an acid-modified polymer, 3.4 parts by mass of infrared-absorbing agent carbon black, 2.7 parts by mass of BM-5 (manufactured by Sekisui Chemical Co., Ltd., a trade name), 28 parts by mass of methanol, and 12 parts by mass of ethanol were mixed to obtain a coating solution for ablation layer formation.

Lumirror X53 (manufactured by Toray Advanced Film Co., Ltd., a registered trade name) having a thickness of 100 μm as a cover film was coated with the coating solution for ablation layer formation such that the film thickness after drying was 3 μm, and subjected to a drying treatment at 90° C. for 2 minutes to obtain a laminate of an ablation layer and a cover film. The layer acid value was 12.6 mg KOH/g. The neutralized salt ratio was 0.95.

Then, the anti-tack film of laminate 1 prepared above was peeled off.

Thereafter, laminate 1 was laminated at 120° C. on the laminate of an ablation layer and a cover film obtained above such that the ablation layer was in contact with the photosensitive resin layer, to prepare an evaluation photosensitive resin structure.

The ablation layer of the photosensitive resin structure prepared in Comparative Example 5 was water soluble and therefore showed good alkali developability, but moisture absorbability over time was high, and peeling of the ablation layer was observed.

Comparative Example 6

First, 50 parts by mass of s-caprolactam, 40 parts by mass of N,N-di(γ-aminopropyl)piperazine adipate, 10 parts by mass of 1,3-bisaminomethylcyclohexane adipate, and 100 parts by mass of water were heated under a nitrogen atmosphere in an autoclave. After being pressured and reacted under an internal pressure of 10 kg/cm² for 2 hours, the mixture was reacted for 1 hour under normal pressure to obtain a tertiary nitrogen-containing polyamide.

Next, 3.8 parts by mass of the tertiary nitrogen-containing polyamide synthesized above, 0.1 parts by mass of RWU-0018 (manufactured by Sannan Chemical Industry Co., Ltd., a trade name, an acid value of 420 mg KOH/g) as an acid-modified polymer, 3.4 parts by mass of infrared-absorbing agent carbon black, 2.7 parts by mass of BM-5 (manufactured by Sekisui Chemical Co., Ltd., a trade name), 28 parts by mass of methanol, and 12 parts by mass of ethanol were mixed to obtain a coating solution for ablation layer formation.

Lumirror X53 (manufactured by Toray Advanced Film Co., Ltd., a registered trade name) having a thickness of 100 μm as a cover film was coated with the coating solution for ablation layer formation such that the film thickness after drying was 3 μm, and subjected to a drying treatment at 90° C. for 2 minutes to obtain a laminate of an ablation layer and a cover film. The layer acid value was 4.2 mg KOH/g. The neutralized salt ratio was 0.95.

Then, the anti-tack film of laminate 1 prepared above was peeled off.

Thereafter, laminate 1 was laminated at 120° C. on the laminate of an ablation layer and a cover film obtained above such that the ablation layer was in contact with the photosensitive resin layer, to prepare an evaluation photosensitive resin structure.

The ablation layer of the photosensitive resin structure prepared in Comparative Example 6 was water soluble and therefore showed good alkali developability, but moisture absorbability over time was high, and peeling of the ablation layer was observed.

Comparative Example 7

First, 10 parts by mass of triethylamine was added to 100 parts by mass of carboxylic acid-modified acrylic polymer UC-3510 (manufactured by Toagosei Co., Ltd., a trade name, an acid value of 70 mg KOH/g, a glass transition temperature of −50° C., a number average molecular weight of 2000) to neutralize the carboxylic acid of UC-3510.

Next, 0.5 parts by mass of UC-3510 neutralized above, 7.3 parts by mass of Black Dispersion (2) (manufactured by Showa Ink Manufacturing Co., Ltd., a trade name, a dispersion of 40% by mass of carbon black and 7.5% by mass of a dispersing agent) as a dispersion of infrared-absorbing agent carbon black, 1.3 parts by mass of Tuftec H1051 (manufactured by Asahi Kasei Corporation, a registered trade name, a styrene content of 42% by mass) as a hydrogenated product of a styrene-butadiene-styrene elastomer, 0.4 parts by mass of KF-351 (manufactured by Shin-Etsu Chemical Co., Ltd., a trade name) as a silicone resin, and 44 parts by mass of toluene were mixed to obtain a coating solution for ablation layer formation.

Lumirror X53 (manufactured by Toray Advanced Film Co., Ltd., a registered trade name) having a thickness of 100 μm as a cover film was coated with the coating solution for ablation layer formation such that the film thickness after drying was 3 μm, and subjected to a drying treatment at 90° C. for 2 minutes to obtain a laminate of an ablation layer and a cover film. The layer acid value was 6.2 mg KOH/g. The neutralized salt ratio was 0.95.

Then, the anti-tack film of laminate 1 prepared above was peeled off.

Thereafter, laminate 1 was laminated at 120° C. on the laminate of an ablation layer and a cover film obtained above such that the ablation layer was in contact with the photosensitive resin layer, to prepare an evaluation photosensitive resin structure.

The ablation layer of the photosensitive resin structure prepared in Comparative Example 7 showed good alkali developability. However, moisture absorbability over time was high, and the ablation layer firmly adhered to the cover film and partially peeled off.

TABLE 1

| | | Example 1 | Example 2 | Example 3 | Example 4 |
|---|---|---|---|---|---|
| Polymer | UC-3510 (part by mass) | 0.5 | | 0.5 | |
| | UC-3000 (part by mass) | | 0.5 | | |
| | (ACA)Z250 (part by mass) | | | | 1.5 |
| | PP-401 (part by mass) | | | | |
| | RWU-0018 (part by mass) | | | | |
| | 802 (part by mass) | | | | |
| | GL-05 (part by mass) | | | | |
| Neutralization ratio adjuster | Triethylamine (part by mass) | | | | |
| | Acetic acid (part by mass) | | | | |
| Infrared-absorbing agent | Black Dispersion (1) (part by mass) | | | | 7.3 |
| | Black Dispersion (2) (part by mass) | 7.3 | 7.3 | 7.3 | |
| | B4360 (part by mass) | | | | |
| | Carbon black (part by mass) | | | | |
| Styrene polymer | H1051 (part by mass) | 1.3 | 1.3 | | |
| | H1043 (part by mass) | | | | |
| Polyamide | MM6900 (part by mass) | | | | |
| | Tertiary nitrogen-containing polyamide (part by mass) | | | | |
| Styrene maleic acid polymer ester | RV23 (part by mass) | | | | |
| | RU30 (part by mass) | | | | |
| Butyral resin | BM-5 (part by mass) | | | | |
| Silicone resin | KF-351 (part by mass) | 0.4 | 0.4 | | |
| Polyvinyl alcohol | GH-22 (Thickness/μm) | | | | |
| | KH-17 (Thickness/μm) | | | | |
| | Acidic group | Carboxylic acid group | Carboxylic acid group | Carboxylic acid group | Carboxylic acid group |
| | Layer acid value (mgKOH/g) | 6.2 | 6.5 | 8.8 | 20.8 |
| | Neutralized salt ratio | 0.01 | 0.005 | 0.01 | 0.02 |
| | Developability test | ○ | ○ | ○ | ◎ |
| | Scratch resistance (g) | 10 | 10 | 10 | 10 |
| | Over-time moisture absorbability test (ratio of peel strength) | ◎ 1.1 | ◎ 1.1 | ◎ 1.2 | ◎ 1.1 |
| | Top shape of pattern | Curved | Curved | Curved | Curved |

| | | Example 5 | Example 6 | Example 7 | Example 8 | Example 9 | Example 10 |
|---|---|---|---|---|---|---|---|
| Polymer | UC-3510 (part by mass) | 0.5 | 2 | 0.5 | | 0.5 | |
| | UC-3000 (part by mass) | | | | | | 0.5 |
| | (ACA)Z250 (part by mass) | 0.5 | | | | | |
| | PP-401 (part by mass) | | | | 2 | | |
| | RWU-0018 (part by mass) | | | | | | |
| | 802 (part by mass) | | | | | | |
| | GL-05 (part by mass) | | | | | | |

TABLE 1-continued

|  |  | Example 5 | Example 6 | Example 7 | Example 8 | Example 9 | Example 10 |
|---|---|---|---|---|---|---|---|
| Neutralization ratio adjuster | Triethylamine (part by mass) |  |  |  |  |  |  |
|  | Acetic acid (part by mass) |  |  |  |  |  |  |
| Infrared-absorbing agent | Black Dispersion (1) (part by mass) | 7.3 |  |  | 7.3 | 7.3 | 7.3 |
|  | Black Dispersion (2) (part by mass) |  | 7.3 | 2.5 |  |  |  |
|  | B4360 (part by mass) |  |  |  |  |  |  |
|  | Carbon black (part by mass) |  |  |  |  |  |  |
| Styrene polymer | H1051 (part by mass) |  |  | 1 |  | 1.3 | 1.3 |
|  | H1043 (part by mass) |  | 1.3 |  |  |  |  |
| Polyamide | MM6900 (part by mass) |  |  |  |  |  |  |
|  | Tertiary nitrogen-containing polyamide (part by mass) |  |  |  |  |  |  |
| Styrene maleic acid polymer ester | RV23 (part by mass) |  |  |  |  | 0.5 |  |
|  | RU30 (part by mass) |  |  |  |  |  | 0.5 |
| Butyral resin | BM-5 (part by mass) |  |  |  |  |  |  |
| Silicone resin | KF-351 (part by mass) |  |  | 0.2 |  | 0.4 | 0.4 |
| Polyvinyl alcohol | GH-22 (Thickness/μm) |  |  |  |  |  | 1 |
|  | KH-17 (Thickness/μm) |  |  |  |  |  |  |
|  | Acidic group | Carboxylic acid group | Carboxylic acid group | Carboxylic acid group | Phosphoric acid group | Carboxylic acid group | Carboxylic acid group |
|  | Layer acid value (mgKOH/g) | 15.6 | 20.7 | 12.1 | 89.3 | 5.7 | 6 |
|  | Neutralized salt ratio | 0.02 | 0.01 | 0.01 | 0.1 | 0.01 | 0.005 |
|  | Developability test | ⊚ | ⊚ | ⊚ | ⊚ | ○ | ○ |
|  | Scratch resistance (g) | 10 | 10 | 10 | 10 | 30 | 30 |
|  | Over-time moisture absorbability test (ratio of peel strength) | ⊚1.3 | ⊚1.1 | ⊚1.1 | ⊚1.4 | ⊚1.2 | ⊚1.1 |
|  | Top shape of pattern | Curved | Curved | Curved | Curved | Curved | Planar |

|  |  | Example 11 | Example 12 | Example 13 | Example 14 | Example 15 | Example 16 | Example 17 | Example 18 |
|---|---|---|---|---|---|---|---|---|---|
| Polymer | UC-3510 (part by mass) | 1.3 | 2 | 0.5 |  |  |  |  |  |
|  | UC-3000 (part by mass) |  |  |  | 0.5 | 0.5 |  |  | 0.5 |
|  | (ACA)Z250 (part by mass) |  |  |  |  |  |  |  |  |
|  | PP-401 (part by mass) |  |  |  |  |  |  |  |  |
|  | RWU-0018 (part by mass) |  |  |  |  |  | 5 | 5 |  |
|  | 802 (part by mass) |  |  |  |  |  |  |  |  |
|  | GL-05 (part by mass) |  |  |  |  |  |  |  |  |
| Neutralization ratio adjuster | Triethylamine (part by mass) |  |  |  | 0.05 | 0.02 | 0.06 |  |  |
|  | Acetic acid (part by mass) |  |  |  |  |  |  | 2 | 1.5 |
| Infrared-absorbing agent | Black Dispersion (1) (part by mass) |  |  |  |  |  |  |  |  |
|  | Black Dispersion (2) (part by mass) | 10 |  | 7.3 | 7.3 | 7.3 |  |  | 7.3 |
|  | B4360 (part by mass) |  | 2 |  |  |  | 2 | 2 |  |
|  | Carbon black (part by mass) |  |  |  |  |  |  |  |  |
| Styrene polymer | H1051 (part by mass) | 4 | 1.3 | 1.3 | 1.3 | 1.3 |  |  |  |
|  | H1043 (part by mass) |  |  |  |  |  |  |  |  |
| Polyamide | MM6900 (part by mass) |  |  |  |  |  |  | 5 | 1.3 |
|  | Tertiary nitrogen-containing polyamide (part by mass) |  |  |  |  |  |  |  |  |
| Styrene maleic acid polymer ester | RV23 (part by mass) | 2 |  |  |  |  |  |  | 0.5 |
|  | RU30 (part by mass) |  |  |  |  |  |  |  |  |
| Butyral resin | BM-5 (part by mass) |  |  |  |  |  |  |  |  |
| Silicone resin | KF-351 (part by mass) | 0.2 | 0.4 | 0.4 | 0.4 | 0.4 |  |  | 0.4 |
| Polyvinyl alcohol | GH-22 (Thickness/mm) | 0.2 |  |  |  |  |  |  |  |
|  | KH-17 (Thickness/mm) |  |  |  |  |  |  |  | 1 |
|  | Acidic group | Carboxylic acid group | Carboxylic acid group | Carboxylic acid group | Carboxylic acid group | Carboxylic acid group | Carboxylic acid group | Carboxylic acid group | Carboxylic acid group |

TABLE 1-continued

|  | | | | | | | | |
|---|---|---|---|---|---|---|---|---|
| Acidic group | 7.4 | 24.6 | 6.2 | 6.5 | 6.2 | 300 | 175 | 6 |
| Layer acid value (mgKOH/g) | 0.01 | 0.01 | 0.15 | 0.25 | 0.82 | 0.05 | 0.3 | 0.005 |
| Neutralized salt ratio | ◯ | ◎ | ◯ | ◯ | ◯ | ◎ | ◎ | ◯ |
| Developability test | 110 | 10 | 10 | 10 | 10 | 10 | 10 | 40 |
| Scratch resistance (g) | ◎1.1 | ◎1.1 | ◯1.4 | ◯1.6 | ◯3.6 | ◎1.3 | ◯2.0 | ◎1.1 |
| Over-time moisture absorbability test (ratio of peel strength) | Planar (curved edge) | Curved | Curved | Curved | Curved | Curved | Curved | Planar |
| Top shape of pattern | | | | | | | | |

TABLE 2

| | | Comparative Example 1 | Comparative Example 2 | Comparative Example 3 | Comparative Example 4 | Comparative Example 5 | Comparative Example 6 | Comparative Example 7 |
|---|---|---|---|---|---|---|---|---|
| Polymer | UC-3510 (part by mass) | | 0.1 | | | | | 0.5 |
| | UC-3000 (part by mass) | | | | | | | |
| | (ACA)Z250 (part by mass) | | | | | | | |
| | PP-401 (part by mass) | | | | | | | |
| | RWU-0018 (part by mass) | | | | | 0.3 | 0.1 | |
| | 802 (part by mass) | | | 5 | | | | |
| | GL-05 (part by mass) | | | | 1 | | | |
| Neutralization ratio adjuster | Triethylamine (part by mass) | | | | | | | 0.05 |
| | Acetic acid (part by mass) | | | | | | | |
| Infrared-absorbing agent | Black Dispersion (1) (part by mass) | | | | 7.3 | | | |
| | Black Dispersion (2) (part by mass) | 7.3 | 7.3 | 7.3 | | | | 7.3 |
| | B4360 (part by mass) | | | | | | | |
| | Carbon black (part by mass) | | | | | 3.4 | 3.4 | |
| Styrene polymer | H1051 (part by mass) | 1.3 | 1.3 | 1.3 | | | | 1.3 |
| | H1043 (part by mass) | | | | | | | |
| Polyamide | MM6900 (part by mass) | | | | | | | |
| | Tertiary nitrogen-containing polyamide (part by mass) | | | | | 3.6 | 3.8 | |
| Styrene maleic acid polymer ester | RV23 (part by mass) | | | | | | | |
| | RU30 (part by mass) | | | | | | | |
| Butyral resin | BM-5 (part by mass) | | | | | 2.7 | 2.7 | |
| Silicone resin | KF-351 (part by mass) | 0.4 | 0.4 | 0.4 | | | | 0.4 |
| Polyvinyl alcohol | GH-22 (Thickness/μm) | | | | | | | |
| | KH-17 (Thickness/μm) | | | | | | | |
| | Acidic group | — | Carboxylic acid group | — | — | Carboxylic acid group | Carboxylic acid group | Carboxylic acid group |
| | Layer acid value (mgKOH/g) | 0 | 1.3 | <0.5 | 71 | 12.6 | 4.2 | 6.2 |
| | Neutralized salt ratio | — | 0.01 | 0.1 | 0.92 | 0.95 | 0.95 | 0.95 |
| | Developability test | X | X | X | ◎ | ◎ | ◎ | ◯ |
| | Scratch resistance (g) | — | — | — | — | — | — | — |
| | Over-time moisture absorbability test | ◎1.1 | ◎1.1 | ◎1.2 | X | X | X | X |
| | Top shape of pattern | — | — | — | — | — | — | — |

The present application is based on a Japanese patent application (Japanese Patent Application No. 2016-185139) filed with the Japanese Patent Office on Sep. 23, 2016 and a Japanese patent application (Japanese Patent Application No. 2017-008426) filed with the Japanese Patent Office on Jan. 20, 2017, the contents of which are incorporated herein by reference.

INDUSTRIAL APPLICABILITY

The ablation layer for a photosensitive resin for a relief printing plate of the present invention, in addition to being promptly removable by an alkaline aqueous developer, prevents moisture absorption, thus can suppress generation of wrinkles, and is therefore industrially applicable to the general commercial printing field of films, labels, cartons, and the like.

The invention claimed is:

1. An ablation layer for a photosensitive resin for a relief printing plate, the ablation layer comprising at least an acid-modified polymer and an infrared-absorbing agent and having
   a layer acid value as defined below of 2 mg KOH/g or more and 400 mg KOH/g or less, and
   a neutralized salt ratio as defined below of 0.9 or less:
   Layer acid value=(Acid value of the acid-modified polymer)×(Mass ratio of the acid-modified polymer to an entire ablation layer); and Neutralized salt ratio=(Number of moles of polymer wherein acid in the acid-modified polymer exists in neutralized salt state)/(Total number of moles of the acid-modified polymer);

further comprising at least one polymer different from the acid-modified polymer, wherein the at least one polymer different from the acid-modified polymer has a water absorption of 15% or less, and the water absorption is a value obtained when moisture is absorbed until equilibrium is reached at 23° C. and 60% RH by a method in accordance with JIS K 7209;

wherein the at least one polymer different from the acid-modified polymer is at least one selected from the group consisting of a thermoplastic elastomer composed of a copolymer of a monovinyl-substituted aromatic hydrocarbon monomer and a conjugated diene monomer, a hydrogenated product of the copolymer, and a modified product of the copolymer, or the at least one polymer different from the acid-modified polymer is at least one selected from a polyamide and a modified product thereof.

2. An ablation layer for a photosensitive resin for a relief printing plate, the ablation layer comprising at least an acid-modified polymer and an infrared-absorbing agent and having a layer acid value as defined below of 2 mg KOH/g or more and 400 mg KOH/g or less, and a neutralized salt ratio as defined below of 0.9 or less:

Layer acid value=(Acid value of the acid-modified polymer)×(Mass ratio of the acid-modified polymer to an entire ablation layer); and Neutralized salt ratio=(Number of moles of polymer wherein acid in the acid-modified polymer exists in neutralized salt state)/(Total number of moles of the acid-modified polymer);

further comprising at least one polymer different from the acid-modified polymer, wherein the at least one polymer different from the acid-modified polymer has a water absorption of 15% or less, and the water absorption is a value obtained when moisture is absorbed until equilibrium is reached at 23° C. and 60% RH by a method in accordance with JIS K 7209;

wherein the at least one polymer different from the acid-modified polymer comprises a copolymer composed of a monovinyl-substituted aromatic hydrocarbon monomer and an unsaturated dicarboxylic anhydride, and in the copolymer composed of a monovinyl-substituted aromatic hydrocarbon monomer and an unsaturated dicarboxylic anhydride, the unsaturated dicarboxylic anhydride is partially or entirely ring-opened by esterification.

3. The ablation layer of the photosensitive resin layer for the relief printing plate according to claim 2, wherein an acidic group of the acid-modified polymer is a carboxylic acid group or a phosphoric acid group.

4. The ablation layer for the photosensitive resin for the relief printing plate according to claim 2, wherein a content of the acid-modified polymer based on the entire ablation layer is 0.5% by mass or more and 90% by mass or less.

5. The ablation layer of the photosensitive resin layer for the relief printing plate according to claim 2, wherein the acid-modified polymer is an acid-modified acrylic resin and has a number average molecular weight of 1000 or more and 20000 or less.

6. The ablation layer for the photosensitive resin for the relief printing plate according to claim 2, wherein the acid-modified polymer has a glass transition temperature of 40° C. or less.

7. The ablation layer for the photosensitive resin for the relief printing plate according to claim 2, further comprising a silicone resin.

8. A photosensitive resin structure for a relief printing plate, comprising at least:

a support, a photosensitive resin layer disposed on the support, and the ablation layer according to claim 2 disposed on the photosensitive resin layer.

9. A method for producing a relief printing plate, comprising:

irradiating the photosensitive resin structure for a relief printing plate according to claim 8 with an ultraviolet ray from a support side;

performing pattern drawing processing by irradiating the ablation layer with an infrared ray;

exposing a pattern by irradiating the photosensitive resin layer with an ultraviolet ray; and removing the ablation layer and an unexposed portion of the photosensitive resin layer by an alkaline developer.

10. The photosensitive resin structure for the relief printing plate according to claim 8, further comprising an oxygen inhibiting layer between the photosensitive resin layer and the ablation layer, wherein the oxygen inhibiting layer has an oxygen permeability of 4000 cc·20 μm/m²·24 hr·atm or less.

11. The photosensitive resin structure for the relief printing plate according to claim 10, wherein the oxygen inhibiting layer is soluble in a solution containing water in an amount of 50% by mass or more.

12. The photosensitive resin structure for the relief printing plate according to claim 10, wherein the oxygen inhibiting layer is at least one selected from the group consisting of polyvinyl alcohol, partially saponified polyvinyl acetate, a partially saponified poly(ethylene oxide vinyl acetate) graft copolymer, and a water-soluble poly(ethylene-vinyl alcohol) copolymer.

13. The photosensitive resin structure for the relief printing plate according to claim 10, wherein the oxygen inhibiting layer comprises polyvinyl alcohol and/or partially saponified polyvinyl acetate, and the polyvinyl alcohol and/or the partially saponified polyvinyl acetate comprised in the oxygen inhibiting layer has a degree of saponification of 40 mol % or more and 90 mol % or less.

14. A method for producing a relief printing plate, comprising:

irradiating the photosensitive resin structure for a relief printing plate according to claim 10 with an ultraviolet ray from a support side;

performing pattern drawing processing by irradiating the ablation layer with an infrared ray;

exposing a pattern by irradiating the photosensitive resin layer with an ultraviolet ray through the oxygen inhibiting layer; and removing the ablation layer, the oxygen inhibiting layer, and an unexposed portion of the photosensitive resin layer by an alkaline developer.

* * * * *